US010892597B2

(12) United States Patent
Hagino et al.

(10) Patent No.: US 10,892,597 B2
(45) Date of Patent: Jan. 12, 2021

(54) NITRIDE SEMICONDUCTOR LASER AND NITRIDE SEMICONDUCTOR LASER DEVICE

(71) Applicant: PANASONIC CORPORATION, Osaka (JP)

(72) Inventors: Hiroyuki Hagino, Osaka (JP); Osamu Imafuji, Osaka (JP); Shinichiro Nozaki, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/316,602

(22) PCT Filed: Jun. 28, 2017

(86) PCT No.: PCT/JP2017/023718
§ 371 (c)(1),
(2) Date: Jan. 9, 2019

(87) PCT Pub. No.: WO2018/012289
PCT Pub. Date: Jan. 18, 2018

(65) Prior Publication Data
US 2019/0245322 A1 Aug. 8, 2019

(30) Foreign Application Priority Data

Jul. 14, 2016 (JP) .................................. 2016-139787

(51) Int. Cl.
*H01S 5/22* (2006.01)
*H01S 5/028* (2006.01)
(Continued)

(52) U.S. Cl.
CPC .......... *H01S 5/0281* (2013.01); *H01S 5/0421* (2013.01); *H01S 5/04254* (2019.08);
(Continued)

(58) Field of Classification Search
CPC ...... H01S 5/0281; H01S 5/0421; H01S 5/343; H01S 5/0425; H01S 5/2205;
(Continued)

(56) References Cited

U.S. PATENT DOCUMENTS 6,775,311 B2 * 8/2004 Hirukawa .............. B82Y 20/00
372/46.01
7,072,374 B2 * 7/2006 Matsumura ......... H01S 5/04252
372/46.01
(Continued)

FOREIGN PATENT DOCUMENTS

JP       H10-242581 A     9/1998
JP       2001-156384 A    6/2001
(Continued)

OTHER PUBLICATIONS

International Search Report (ISR) dated Aug. 29, 2017 in International (PCT) Application No. PCT/JP2017/023718 (with partial English translation).

*Primary Examiner* — Tod T Van Roy
*Assistant Examiner* — Delma R Fordé
(74) *Attorney, Agent, or Firm* — McDermott Will & Emery LLP

(57) ABSTRACT

A nitride semiconductor laser includes: a first nitride semiconductor layer; a light-emitting layer formed on the first nitride semiconductor layer and including a nitride semiconductor; a second nitride semiconductor layer formed on the light-emitting layer and having a ridge portion; an electrode component formed on the second nitride semiconductor layer, and which is wider than the ridge portion; and a dielectric layer formed on side surfaces of the ridge portion and including $SiO_2$. A space is present between the electrode component and the dielectric layer, and the electrode component is prevented from being in contact with the dielectric
(Continued)

layer by the space, and is in contact with the upper surface of the ridge portion.

4 Claims, 13 Drawing Sheets

(51) Int. Cl.
   *H01S 5/042* (2006.01)
   *H01S 5/343* (2006.01)
   *H01S 5/022* (2006.01)
(52) U.S. Cl.
   CPC .............. *H01S 5/22* (2013.01); *H01S 5/2205* (2013.01); *H01S 5/343* (2013.01); *H01S 5/0224* (2013.01); *H01S 5/02276* (2013.01); *H01S 5/04257* (2019.08); *H01S 5/34333* (2013.01)
(58) Field of Classification Search
   CPC .............. H01S 5/0224; H01S 5/02276; H01S 5/34333; H01S 5/04254; H01S 5/22–2228; H01S 5/04256; H01L 2933/0066
   See application file for complete search history.

(56) References Cited

U.S. PATENT DOCUMENTS

| | | | |
|---|---|---|---|
| 9,899,801 B2* | 2/2018 | Lell | H01S 5/0425 |
| 10,608,404 B2* | 3/2020 | Nadeau | H01S 5/0425 |
| 2003/0099266 A1 | 5/2003 | Watanabe et al. | |
| 2004/0252739 A1 | 12/2004 | Takeuchi et al. | |
| 2005/0041710 A1* | 2/2005 | Makita | H01S 5/22 372/45.01 |
| 2007/0076775 A1* | 4/2007 | Bessho | B82Y 20/00 372/50.121 |
| 2007/0086497 A1* | 4/2007 | Tanaka | H01S 5/02461 372/43.01 |
| 2007/0121691 A1* | 5/2007 | Sugiyama | H01S 5/22 372/43.01 |
| 2007/0217461 A1* | 9/2007 | Masui | B82Y 20/00 372/46.01 |
| 2009/0200571 A1* | 8/2009 | Ishida | H01S 5/34333 257/99 |
| 2011/0116526 A1* | 5/2011 | Sorimachi | H01S 5/0224 372/46.012 |
| 2012/0058585 A1 | 3/2012 | Maegawa et al. | |
| 2012/0099614 A1 | 4/2012 | Yamazaki et al. | |
| 2012/0189029 A1* | 7/2012 | Kashiwagi | H01S 5/0202 372/44.011 |
| 2013/0308667 A1 | 11/2013 | Hagino et al. | |
| 2014/0348196 A1* | 11/2014 | Yoshinaga | H01S 5/3401 372/45.01 |
| 2015/0055670 A1* | 2/2015 | Inoue | H01S 5/343 372/45.01 |

FOREIGN PATENT DOCUMENTS

| | | |
|---|---|---|
| JP | 2003-163407 A | 6/2003 |
| JP | 2004-319987 A | 11/2004 |
| JP | 2005-64328 A | 3/2005 |
| JP | 2008-311292 A | 12/2008 |
| JP | 2009-170708 A | 7/2009 |
| JP | 2009-212176 A | 9/2009 |
| JP | 2012-59890 A | 3/2012 |
| JP | 2012-094564 A | 5/2012 |
| JP | 2013-62315 A | 4/2013 |
| WO | 2012/101686 A1 | 8/2012 |
| WO | WO-2018180524 A1 * | 10/2018 ............. H01S 5/022 |

* cited by examiner

NITRIDE SEMICONDUCTOR LASER AND NITRIDE SEMICONDUCTOR LASER DEVICE

CROSS REFERENCE

This application is the U.S. National Phase under 35 U.S.C. § 371 of International Application No. PCT/JP2017/023718 filed on Jun. 28, 2017, which claims the benefit of Japanese Application No. 2016-139787 filed on Jul. 14, 2016, the entire contents of each are hereby incorporated by reference.

TECHNICAL FIELD

The present disclosure relates to a nitride semiconductor laser and a nitride semiconductor laser device.

BACKGROUND ART

In recent years, attention has been focused on semiconductor lasers as light sources for various applications such as a light source for an image display device such as a display, a projector, and the like, a light source for a vehicular headlamp, a light source for industrial lighting or household lighting, and a light source for industrial equipment such as laser welding equipment, a thin-film annealer, and laser processing equipment. In particular, nitride semiconductor lasers which can cover wavelength bands from ultraviolet to blue are being actively developed. Furthermore, semiconductor lasers to be used as light sources in the above-described applications are desired to have high light output significantly exceeding 1 watt and longer element life at least in the tens of thousands of hours.

A conventional nitride semiconductor laser is disclosed in Patent Literature 1. FIG. 11 is a cross-sectional view of the conventional nitride semiconductor laser disclosed in Patent Literature 1.

As illustrated in FIG. 11, the conventional nitride semiconductor laser 1000 has a structure in which n-type nitride semiconductor layer 1020, active layer 1030, and p-type nitride semiconductor layer 1040 are stacked on substrate 1010 in this order. Ridge stripe 1040a and planar portions 1040b are formed in p-type nitride semiconductor layer 1040. Insulating film 1060 including $SiO_2$ is formed extending from the side surfaces of ridge stripe 1040a and across planar portions 1040b. P-side electrode 1051 is formed on ridge stripe 1040a of p-type nitride semiconductor layer 1040, and pad electrode 1052 is formed on p-side electrode 1051 and insulating film 1060. It should be noted that n-side electrode 1080 is formed on the lower surface of substrate 1010.

CITATION LIST

Patent Literature

PTL 1: Japanese Unexamined Patent Application Publication No. H10-242581

SUMMARY OF THE INVENTION

Technical Problem

However, the conventional nitride semiconductor laser has the problem that the operating voltage increases with energization time.

The present disclosure has as an object to provide a nitride semiconductor laser and a nitride semiconductor laser device which can reduce an increase in operating voltage.

Solution to Problem

In order to achieve the aforementioned object, a nitride semiconductor laser according to an aspect of the present disclosure includes: a first nitride semiconductor layer; a light-emitting layer on the first nitride semiconductor layer, the light-emitting layer including a nitride semiconductor; a second nitride semiconductor layer on the light-emitting layer, the second nitride semiconductor layer having a ridge portion; an electrode component on the second nitride semiconductor layer, the electrode component being wider than the ridge portion; and a dielectric layer on side surfaces of the ridge portion, the dielectric layer including $SiO_2$, wherein a space is present between the electrode component and the dielectric layer, and the electrode component is prevented from being in contact with the dielectric layer by the space, and is in contact with an upper surface of the ridge portion.

In this manner, since the electrode component and the dielectric layer are prevented from being in contact with each other by the space, diffusion of hydrogen contained in the dielectric layer including $SiO_2$ to the electrode component can be prevented. Accordingly, the increase in the operating voltage with energization time can be reduced.

Furthermore, in the nitride semiconductor laser according to an aspect of the present disclosure, the second nitride semiconductor layer may have a planar portion lateral to the ridge portion, the electrode component may include an ohmic electrode and a pad electrode on the ohmic electrode, the ohmic electrode may be in contact with the upper surface of the ridge portion, and the pad electrode may be wider than the ridge portion, and be in contact with an upper surface of the planar portion.

According to this configuration, the drive current of the nitride semiconductor laser flows through the ohmic electrode to the ridge portion. Furthermore, since the pad electrode is formed widely even up to the planar portion, electrical connection by wire bonding, etc., becomes easy.

Furthermore, in the nitride semiconductor laser according to an aspect of the present disclosure, the second nitride semiconductor layer may include a contact layer as a top layer of the ridge portion, and the ohmic electrode may be in contact with an upper surface of the contact layer which is the upper surface of the ridge portion.

According to this configuration, the ohmic electrode and the ridge portion are in a good state of good ohmic contact, and thus current is satisfactorily supplied to the ridge portion.

Furthermore, in the nitride semiconductor laser according to an aspect of the present disclosure, the pad electrode may have an opening communicating with the space.

Accordingly, peeling-off, etc., of the pad electrode can be reduced, and thus an increase in the operating voltage can be further reduced. Furthermore, the manufacturing time of the nitride semiconductor laser can be shortened, and a reliable nitride semiconductor laser can be realized.

Furthermore, in the nitride semiconductor laser according to an aspect of the present disclosure, the ridge portion may have a width of at least 10 μm and at most 50 μm.

According to this configuration, a nitride semiconductor laser capable of being operated at a high light output can be realized.

Furthermore, a nitride semiconductor laser according to another aspect of the present disclosure includes: a first nitride semiconductor layer; a light-emitting layer on the first nitride semiconductor layer, the light-emitting layer including a nitride semiconductor; a second nitride semiconductor layer on the light-emitting layer, the second nitride semiconductor layer having a ridge portion; an electrode component on the second nitride semiconductor layer; a dielectric layer on side surfaces of the ridge portion, the dielectric layer including $SiO_2$; and pad components on the second nitride semiconductor layer, the pad components including a same material as a material of the electrode component, wherein the pad components are not in contact with the dielectric layer, and the electrode component is not in contact with the dielectric layer, and is in contact with an upper surface of the ridge portion.

According to this configuration, an increase in the operating voltage with energization time can be reduced. In addition, the manufacturing time of the nitride semiconductor laser can be reduced, and a reliable nitride semiconductor laser can be realized.

Furthermore, in the nitride semiconductor laser according to the other aspect of the present disclosure, the electrode component may include an ohmic electrode and a pad electrode on the ohmic electrode, and the pad components may include a same material as a material of the pad electrode included in the electrode component.

According to this configuration, an increase in the operating voltage with energization time can be further reduced. Furthermore, by forming the pad component from the same material as the pad electrode, the pad component and the pad electrode can be formed easily.

Furthermore, in the nitride semiconductor laser according to the other aspect of the present disclosure, the second nitride semiconductor layer may include a contact layer as a top layer of the ridge portion, the second nitride semiconductor layer having a planar portion lateral to the ridge portion, the ohmic electrode may be in contact with an upper surface of the contact layer which is the upper surface of the ridge portion, and the ohmic electrode may be in contact with an upper surface of the contact layer which is the upper surface of the ridge portion, and the pad components may be in contact with an upper surface of the planar portion.

According to this configuration, the drive current of the nitride semiconductor laser flows through the ohmic electrode to the ridge portion. In addition, the ohmic electrode and the ridge portion are in a good state of ohmic contact, and thus current is satisfactorily supplied to the ridge portion.

Furthermore, in the nitride semiconductor laser according to the other aspect of the present disclosure, the ridge portion may have a width of at least 10 μm and at most 50 μm, for example.

According to this configuration, a nitride semiconductor laser capable of being operated at a high light output can be realized.

Furthermore, a nitride semiconductor laser device according to an aspect of the present disclosure includes: the nitride semiconductor laser according to the aforementioned aspect or the nitride semiconductor laser according to the aforementioned other aspect; and a submount holding the nitride semiconductor.

According to this configuration, heat generated in the nitride semiconductor laser can be dissipated by being conducted to the submount, and thus a reliable nitride semiconductor laser can be realized.

Furthermore, a nitride semiconductor laser device according to another aspect of the present disclosure includes: the nitride semiconductor laser according to the aforementioned other aspect; and a submount holding the nitride semiconductor, wherein the electrode component and the pad components are connected to the submount.

According to this configuration, heat generated in the nitride semiconductor laser can be efficiently dissipated by being conducted to the submount via the electrode component and the pad component, and thus a reliable nitride semiconductor laser can be realized.

Furthermore, in the nitride semiconductor laser device according to the other aspect, the submount includes a base, an electrode on one surface of the base, and a solder layer on the electrode, and the electrode component and the pad components are connected to the solder layer.

According to this configuration, current can be supplied from the submount to the nitride semiconductor laser, and the heat-dissipation performance of the nitride semiconductor laser can be improved. Therefore, a more reliable nitride semiconductor laser can be realized.

Advantageous Effect of Invention

An increase in the operating voltage can be reduced.

DESCRIPTION OF EXEMPLARY EMBODIMENTS

Hereinafter, embodiments of the present disclosure will be described with reference to the drawings. The embodiments described below each illustrate a preferred specific example of the present disclosure. Thus, the numerical values, shapes, materials, elements, the arrangement and connection of the elements, steps (processes) and the order of the steps, etc., indicated in the following embodiments are mere examples, and are not intended to limit the present disclosure. Therefore, among the elements in the following embodiments, elements not recited in any of the independent claims defining the most generic concept of the present disclosure are described as optional elements.

Furthermore, the drawings are schematic and do not necessarily provide precise depictions. Therefore, the scale is not always the same in the respective drawings. Throughout the drawings, like elements share like reference signs and redundant description is omitted or simplified.

Furthermore, in this DESCRIPTION and drawings thereof, the X axis, the Y axis, and the Z axis represent the three axes in the three-dimensional rectangular coordinate system. The X axis and the Y axis are orthogonal to each other, and both are also orthogonal to the Z axis.

Embodiment 1

[Configuration of Nitride Semiconductor Laser]

Figure 1:
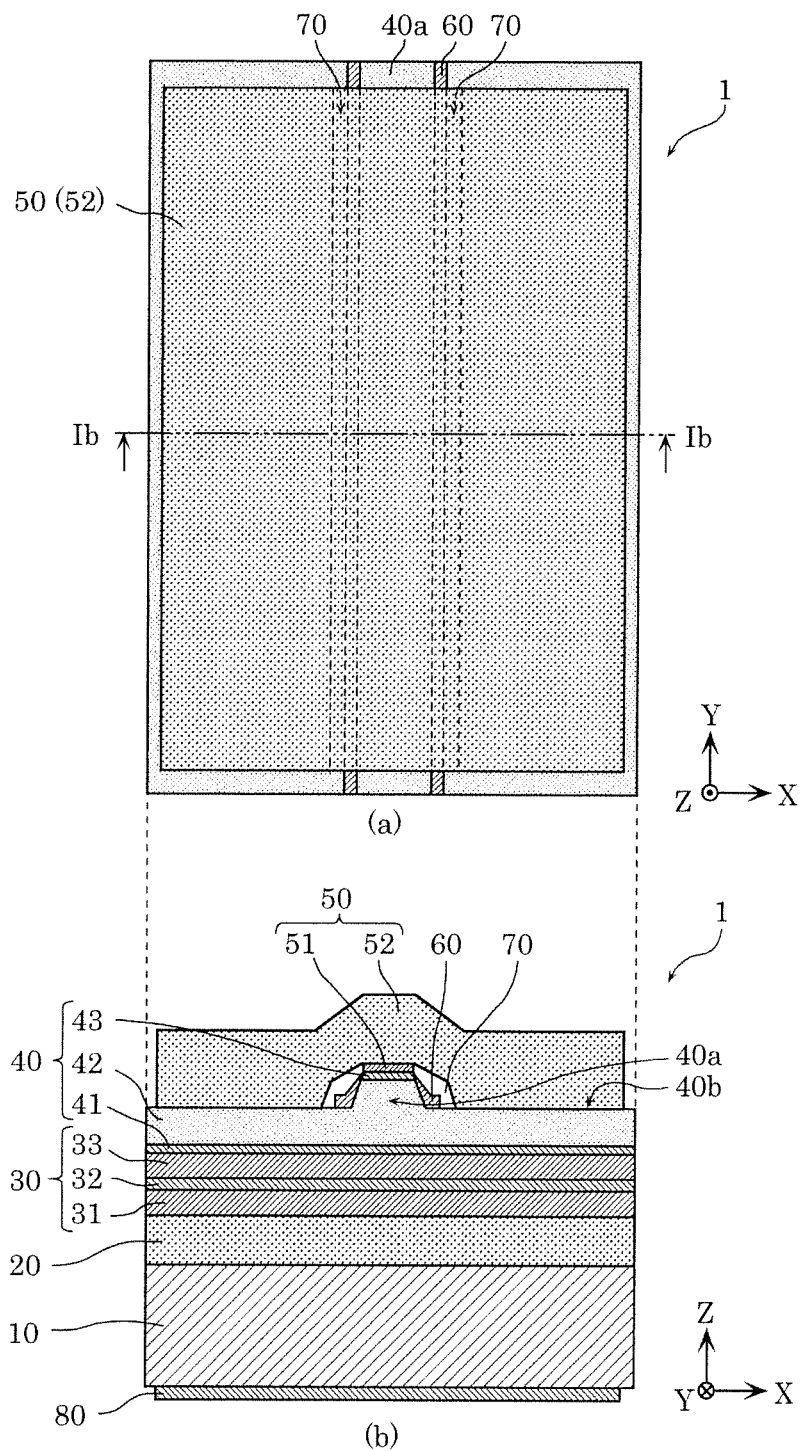
FIG. 1 is a diagram illustrating a configuration of a nitride semiconductor laser according to Embodiment 1.

First, a configuration of nitride semiconductor laser 1 according to Embodiment 1 will be described with reference to FIG. 1. FIG. 1 is a diagram illustrating a configuration of nitride semiconductor laser 1 according to Embodiment 1. Here, (a) in FIG. 1 is a plan view of nitride semiconductor laser 1, and (b) in FIG. 1 is a cross-sectional view of nitride semiconductor laser 1 taken along line Ib-Ib in (a) in FIG. 1.

As illustrated in (a) and (b) in FIG. 1, nitride semiconductor laser 1 according to this embodiment is a semiconductor laser element including a nitride semiconductor material, and includes substrate 10, first nitride semiconductor layer 20, light-emitting layer 30, second nitride semiconductor layer 40, electrode component 50, and dielectric layer 60. Spaces 70 are formed between electrode component 50 and dielectric layer 60.

Second nitride semiconductor layer 40 includes stripe-shaped ridge portion 40a which extends in the laser resonator length direction (the Y-axis direction), and planar portions 40b which spread in the lateral direction (the X-axis direction) from the foot of ridge portion 40a.

Although the width and the height of ridge portion 40a are not particularly limited, as an example, the width (stripe width) of ridge portion 40a is at least 1 µm and at most 100 µm, and the height of ridge portion 40a is at least 100 nm and at most 1 µm. In order to enable nitride semiconductor laser 1 to operate at a high light output (for example, at watt-class), the width of ridge portion 40a may be at least 10 µm and at most 50 µm, and the height of ridge portion 40a may be at least 300 nm and at most 800 nm, for example.

Substrate 10 is a GaN substrate, for example. In this embodiment, an n-type hexagonal GaN substrate whose principal surface is a (0001) plane is used as substrate 10.

First nitride semiconductor layer 20 is formed on substrate 10. First nitride semiconductor layer 20 is, for example, an n-side cladding layer including n-type AlGaN.

Light-emitting layer 30 is formed on first nitride semiconductor layer 20. Light-emitting layer 30 includes a nitride semiconductor. Light-emitting layer 30 has a structure in which, for example, n-side light guide layer 31 including n-GaN, active layer 32 which is an InGaN quantum well layer, and p-side light guide layer 33 including p-GaN are stacked.

Second nitride semiconductor layer 40 is formed on light-emitting layer 30. Second nitride semiconductor layer 40 is a stacked structure of, for example, electron barrier layer 41 including AlGaN, p-side cladding layer 42 including a p-type AlGaN layer, and p-side contact layer 43 including p-type GaN. P-side contact layer 43 is formed as the top layer of ridge portion 40a.

P-side cladding layer 42 includes a protruding portion. This protruding portion of p-side cladding layer 42 and p-side contact layer 43 form ridge portion 40a. Furthermore, p-side cladding layer 42 has flat portions at both sides of ridge portion 40a as planar portions 40b. In other words, the top surface of planar portions 40b is the upper surface of p-side cladding layer 42, and p-side contact layer 43 is not formed on the top surface of planar portions 40b.

Electrode component 50 is formed on second nitride semiconductor layer 40. Electrode component 50 is wider than ridge portion 40a. In other words, the width (width in the X-axis direction) of electrode component 50 is greater than the width (width in the X-axis direction) of ridge portion 40a. Electrode component 50 is prevented from being in contact with dielectric layer 60 by spaces 70. Each space 70 is, for example, a layer of air. Furthermore, electrode component 50 is in contact with the upper surface of ridge portion 40a.

In this embodiment, electrode component 50 includes p-side electrode 51 for supplying current and pad electrode 52 formed on p-side electrode 51.

P-side electrode 51 is in contact with the upper surface of ridge portion 40a. P-side electrode 51 is an ohmic electrode that is in ohmic contact with p-side contact layer 43 above ridge portion 40a, and is in contact with the upper surface of p-side contact layer 43 which is the upper surface of ridge portion 40a. P-side electrode 51 is, for example, including a metal material such as Pd, Pt, or Ni. In this embodiment, p-side electrode 51 has a two-layer structure of Pd/Pt.

Pad electrode 52 is wider than ridge portion 40a, and is in contact with the upper surface of planar portions 40b. In other words, pad electrode 52 is formed to cover ridge portion 40a and planar portions 40b. The material of pad electrode 52 is metal such as Ti, for example.

Furthermore, pad electrode 52 is in contact with p-side electrode 51, but is formed extending from p-side electrode 51 and across planar portions 40b so as not to be in contact with dielectric layer 60. Pad electrode 52 is prevented from being in contact with dielectric layer 60 by spaces 70. In other words, spaces 70 are present between pad electrode 52 and dielectric layer 60 to separate pad electrode 52 and dielectric layer 60. Pad electrode 52 is in direct contact with p-side cladding layer 42 in planar portions 40b, outside of spaces 70.

Since there a contact layer is not present on the top surface of planar portions 40b of p-side cladding layer 42, pad electrode 52 and p-side cladding layer 42 (planar portions 40b) are in Schottky contact, for example, and the supply of current from pad electrode 52 to second nitride semiconductor layer 40 is reduced.

It should be noted that, as illustrated in (a) in FIG. 1, pad electrode 52 is formed within second nitride semiconductor layer 40 so as to improve the yield when dicing nitride semiconductor laser 1. Specifically, in a top view of nitride semiconductor laser 1, pad electrode 52 is not formed on the peripheral edges of nitride semiconductor laser 1. In other words, nitride semiconductor laser 1 includes, on the peripheral edges, a non-current injection region to which current is not supplied. Furthermore, the cross-sectional shape of any region in which pad electrode 52 is formed has the structure illustrated in (b) in FIG. 1.

Dielectric layer 60 is an insulating film including $SiO_2$ formed on the side surface of ridge portion 40a so as to confine light. Specifically, dielectric layer 60 is formed continuously to extend from the side surface of ridge portion 40a and across planar portions 40b. In this embodiment, dielectric layer 60 is formed continuously across the side surface of p-side contact layer 43, the side surface of the protruding portion of p-side cladding layer 42, and the upper surface of p-side cladding layer 42, in the periphery of ridge portion 40a.

The shape of dielectric layer 60 is not particularly limited, and it is sufficient that dielectric layer 60 is in contact with the side surface of ridge portion 40a and planar portions 40b. Accordingly, light emitted directly below ridge portion 40a can be stably confined.

Furthermore, in a nitride semiconductor laser aimed at being operated at a high light output (high output operation), an edge surface coat film such as a dielectric multilayer film is formed on the light-emitting edge surface. It is difficult to form the edge surface coat film only on the edge surface, and thus the edge surface coat film is formed even on the upper surface of nitride semiconductor laser 1. In this case, since pad electrode 52 is not formed on the end portion in the longitudinal direction (the Y-axis direction) of nitride semiconductor laser 1, when the edge surface coat film is formed even on the upper surface of nitride semiconductor laser 1, dielectric layer 60 and the edge surface coat film may come in contact at the end portion in the longitudinal direction of nitride semiconductor laser 1. In this case, when dielectric layer 60 is not formed or is too thin to confine light, light loss is caused by being affected by the edge surface coat film. In view of this, the film thickness of dielectric layer 60 is, for example, at least 100 nm to sufficiently confine light generated by light-emitting layer 30. On the other hand, when dielectric layer 60 is too thick, forming of spaces 70 becomes difficult, and thus the film thickness of dielectric layer 60 is, for example, less than or equal to the height of ridge portion 40a.

Furthermore, although leak current may occur on the side surface of ridge portion 40a and planar portions 40b due to remaining etching damage from the etching process when ridge portion 40a is formed, occurrence of unnecessary leak current can be reduced by covering ridge portion 40a with dielectric layer 60.

It should be noted that n-side electrode 80 is formed on the lower surface of substrate 10 as an ohmic electrode that is in ohmic contact with substrate 10.

[Method of Manufacturing Nitride Semiconductor Laser]

Next, the method of manufacturing nitride semiconductor laser 1 according to Embodiment 1 will be described with reference to FIG. 2A to FIG. 2L. FIG. 2A to FIG. 2L are cross-sectional views for each process in the method of manufacturing nitride semiconductor laser 1 according to Embodiment 1.

Figure 2A:
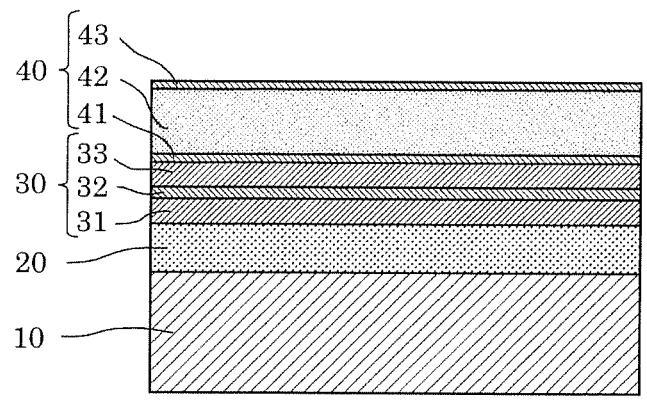
FIG. 2A is a cross-sectional view illustrating processes of forming each of a first nitride semiconductor layer, a light-emitting layer, and a second nitride semiconductor layer in a method of manufacturing the nitride semiconductor laser according to Embodiment 1.

First, as illustrated in FIG. 2A, first nitride semiconductor layer 20, light-emitting layer 30, and second nitride semiconductor layer 40 are sequentially formed above substrate 10 which is an n-type hexagonal GaN substrate whose principal surface is a (0001) plane, by metal organic chemical vapor deposition (MOCVD).

Specifically, as first nitride semiconductor layer 20, an n-side cladding layer including n-type AlGaN is grown 3 µm on substrate 10. Subsequently, n-side light guide layer 31 including n-GaN is grown 0.1 µm. Subsequently, active layer 32, which includes three cycles of a barrier layer including InGaN and an InGaN quantum well layer, is grown. Subsequently, 0.1 µm of p-side light guide layer 33 including p-GaN is grown, Subsequently, electron barrier layer 41 including AlGaN is grown 10 nm. Subsequently, p-side cladding layer 42 having a 0.48 µm strained-layer superlattice structure formed by repeating a p-AlGaN layer (1.5 nm) and a GaN layer (1.5 nm) for 160 cycles is grown. Subsequently, p-side contact layer 43 including p-GaN is grown 0.05 µm. Here, in each layer, trimethylgallium (TMG), trimethylaluminum (TMA), and trimethylindium (TMI) are used as metalorganic raw material containing Ga, Al, and In, for example. Furthermore, ammonia (NH3) is used as a nitrogen raw material.

Figure 2B:
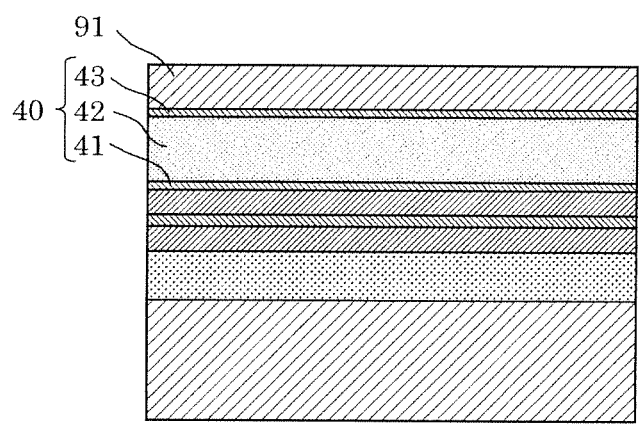
FIG. 2B is a cross-sectional view illustrating a process of forming a first protection film in the method of manufacturing the nitride semiconductor laser according to Embodiment 1.

Next, as illustrated in FIG. 2B, first protection film 91 is formed on second nitride semiconductor layer 40. Specifically, 300 nm of a silicon oxide ($SiO_2$) film is formed on p-side contact layer 43 as first protection film 91, by plasma chemical vapor deposition (CVD) using silane ($SiH_4$).

It should be noted that the method of forming first protection film 91 is not particularly limited to plasma CVD, and a known film-forming method such as thermal CVD, sputtering, vacuum evaporation, or pulse laser film-forming can be used, for example. Furthermore, the film-forming material of first protection film 91 is not particularly limited to the above, and only needs to be a material having selectivity for etching of second nitride semiconductor layer 40 (p-side cladding layer 42, p-side contact layer 43) described below, such as dielectric or metal, for example.

Figure 2C:
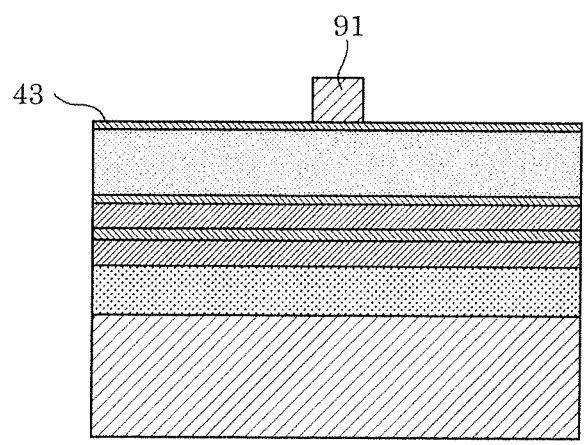
FIG. 2C is a cross-sectional view illustrating a process of patterning the first protection film in the method of manufacturing the nitride semiconductor laser according to Embodiment 1.

Next, as illustrated in FIG. 2C, first protection film 91 is selectively removed using photolithography and etching so that first protection film 91 is left in a the shape of a stripe. For the etching method, for example, dry etching by reactive ion etching (RIE) using fluorine-based gas such as $CF_4$, or wet etching using hydrofluoric acid (HF) diluted approximately 1:10 can be used.

Figure 2D:
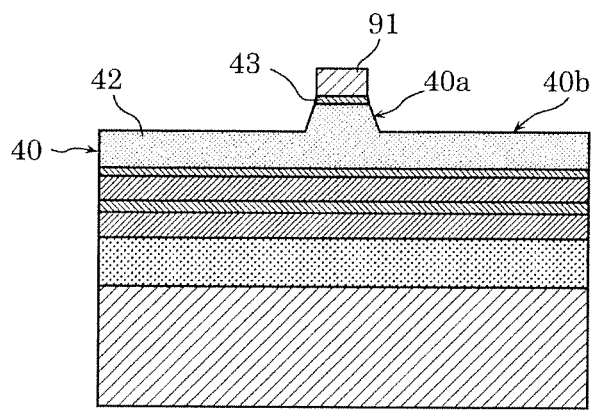
FIG. 2D is a cross-sectional view illustrating a process of forming a ridge portion and planar portions in the method of manufacturing the nitride semiconductor laser according to Embodiment 1.

Next, as illustrated in FIG. 2D, ridge portion 40a and planar portions 40b are formed in second nitride semiconductor layer 40 by etching p-side contact layer 43 and p-side cladding layer 42, using first protection film 91 which has been formed in the shape of a stripe as a mask. For the etching of p-side contact layer 43 and p-side cladding layer 42, dry etching by RIE using chlorine-based gas such as $Cl_2$ is used, for example.

Figure 2E:
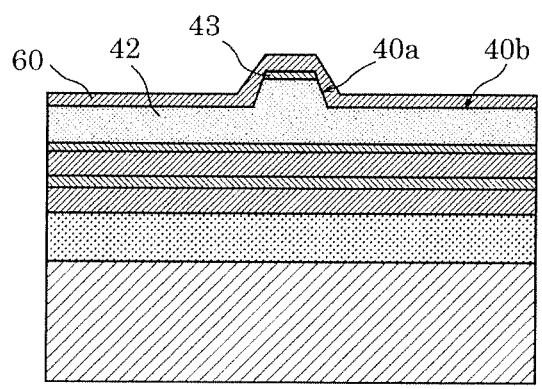
FIG. 2E is a cross-sectional view illustrating a process of forming a dielectric layer in the method of manufacturing the nitride semiconductor laser according to Embodiment 1.

Next, as illustrated in FIG. 2E, after removing stripe-shaped first protection film 91 by wet etching using hydrofluoric acid, or the like, dielectric layer 60 is formed to cover p-side contact layer 43 and p-side cladding layer 42. In other words, dielectric layer 60 is formed on ridge portion 40a and planar portions 40b. As dielectric layer 60, for example, a 300 nm silicon oxide ($SiO_2$) film is formed by plasma CVD using silane ($SiH_4$).

It should be noted that the method of forming dielectric layer 60 is not limited to plasma CVD, and a film-forming method such as thermal CVD, sputtering, vacuum evaporation, or pulse laser film-forming may be used.

Figure 2F:
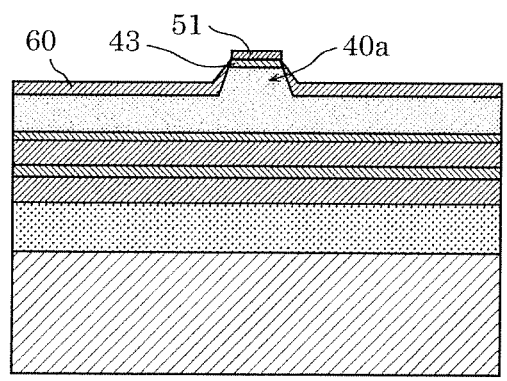
FIG. 2F is a cross-sectional view illustrating a process of forming a p-side electrode in the method of manufacturing the nitride semiconductor laser according to Embodiment 1.

Next, as illustrated in FIG. 2F, the upper surface of p-side contact laser 43 is exposed by removing only the portion of dielectric layer 60 that is on ridge portion 40a by photolithography and wet etching using hydrofluoric acid (first patterning of dielectric layer 60). Thereafter, p-side electrode 51 including Pd/Pt is formed only on ridge portion 40a by vacuum evaporation and lift-off. Specifically, p-side electrode 51 is formed on p-side contact layer 43 exposed from dielectric layer 60.

It should be noted that the method of forming p-side electrode 51 is not particularly limited to vacuum evaporation, and may be sputtering or pulse laser film-forming. Furthermore, the electrode material of p-side electrode 51 only needs to be a material capable of having an ohmic junction with second nitride semiconductor layer 40 (p-side contact layer 43) such as an Ni/Au-based or a Pt-based material.

Figure 2G:
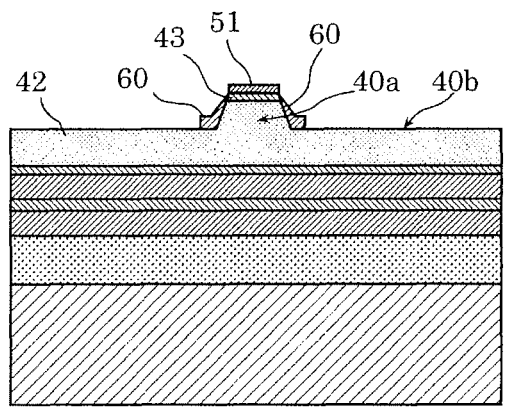
FIG. 2G is a cross-sectional view illustrating a process of patterning the dielectric layer in the method of manufacturing the nitride semiconductor laser according to Embodiment 1.

Next, as illustrated in FIG. 2G, dielectric layer 60 is removed except in the periphery of ridge portion 40a by photolithography and etching (second patterning of dielectric layer 60). In other words, dielectric layer 60 is selectively removed so that dielectric layer 60 is left only on the side surfaces of ridge portion 40a and planar portions 40b at the foot of ridge portion 40a. Accordingly, planar portions 40b are exposed.

Figure 2H:
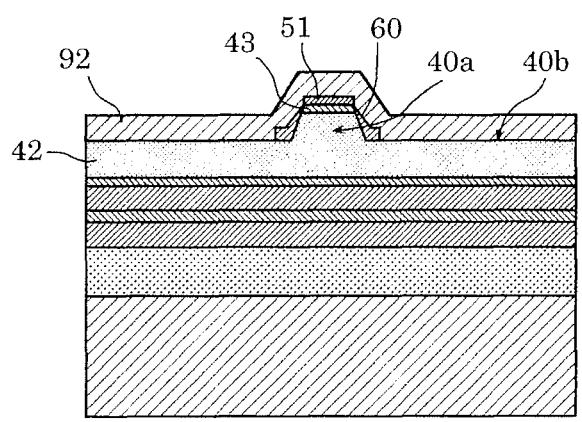
FIG. 2H is a cross-sectional view illustrating a process of forming a second protection film in the method of manufacturing the nitride semiconductor laser according to Embodiment 1.

As illustrated in FIG. 2H, second protection film 92 is formed in order to form spaces 70 only above dielectric layer 60. Specifically, second protection film 92 is formed on p-side electrode 51, dielectric layer 60, and p-side contact layer 42.

Several materials can be considered for the material of second protection film 92, but a resist is used in this embodiment. Furthermore, as the material of second protection film 92, it is sufficient to use a material having a sufficiently higher etching speed compared to dielectric layer 60 and p-side electrode 51. In this embodiment, an positive photoresist (THMR-8900) manufactured by TOKYO OHKA KOGYO Co., Ltd. is used. When a resist is used as second protection film 92, second protection film 92 can be formed by forming the resist material on the entire surface of the top-most layer above substrate 10 by spin coating, and baking at a temperature of 150° C. to 200° C.

It should be noted that second protection film 92 is not particularly limited to an organic material such as a resist, and any material can be used as long as the material has high etching selectivity with respect to dielectric layer 60 including $SiO_2$, and may be a non-organic material such as AlN. In this case, second protection film 92 including AlN can be formed by sputtering, or the like.

Figure 2I:
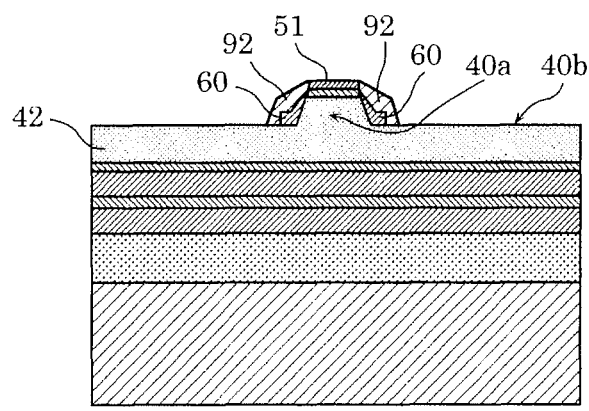
FIG. 2I is a cross-sectional view illustrating a process of patterning the second protection film in the method of manufacturing the nitride semiconductor laser according to Embodiment 1.

Next, as illustrated in FIG. 2I, second protection film 92 is patterned in a predetermined shape by etching second protection film 92 to remove the existing second protection film 92 except for second protection film 92 on the side surfaces of ridge portion 40a. Specifically, second protection film 92 above ridge portion 40a and second protection film 92 on planar portions 40b is removed so that only second protection film 92 which covers dielectric layer 60 is left. Accordingly, the upper surface of p-side electrode 51 and planar portions 40b are exposed.

For example, when second protection film 92 is a resist, second protection film 92 can be removed by dry etching using oxygen ($O_2$), for example. At this time, since second protection film 92 formed on the side surfaces of ridge portion 40a becomes thicker than second protection film 92 formed above ridge portion 40a and on planar portions 40b, when etching is finished at the time when second protection film 92 on ridge 40b is eliminated, it is possible to leave second protection film 92 only on the side surfaces of ridge portion 40a, as illustrated in FIG. 2I.

It should be noted that when second protection film 92 is a non-organic film including AlN, or the like, second protection film 92 can be patterned in a predetermined shape by photolithography and etching.

Figure 2J:
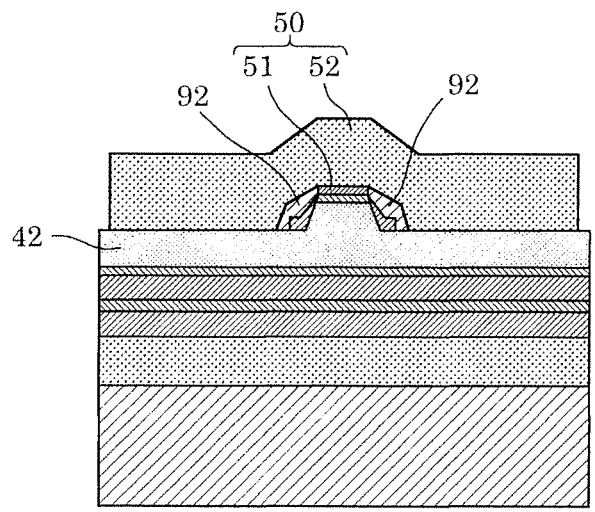
FIG. 2J is a cross-sectional view illustrating a process of forming a pad electrode in the method of manufacturing the nitride semiconductor laser according to Embodiment 1.

Next, as illustrated in FIG. 2J, pad electrode 52 is formed to cover the exposed portions of p-side electrode 51, second protection film 92, and p-side cladding layer 42. Specifically, pad electrode 52 including Ti/Pt/Au is formed on the entire surface of the top-most layer above substrate 10 by vacuum evaporation, etc., and then patterned by photolithography and etching to form pad electrode 52 in a predetermined shape on the exposed portions of p-side electrode 51, second protection film 92, and p-side cladding layer 42. Accordingly, electrode component 50 including p-side electrode 51 and pad electrode 52 is formed.

It should be noted that pad electrode 52 is not limited to a three-layer structure of Ti/Pt/Au, and any metal materials such as Ni, Pd, Ag, Rh, Pt, and Au may be combined.

Figure 2K:
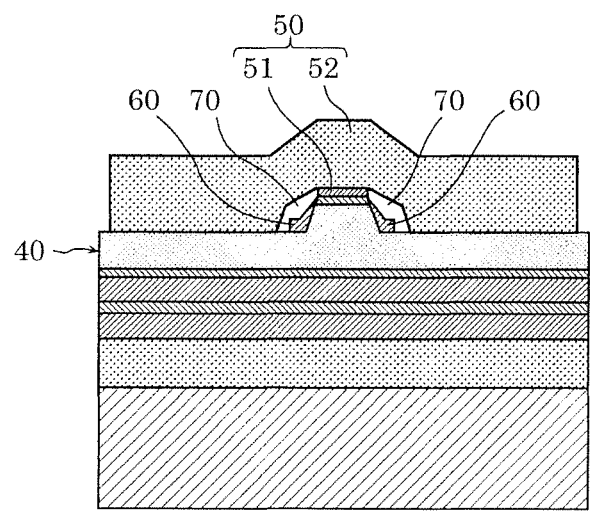
FIG. 2K is a cross-sectional view illustrating a process of forming spaces in the method of manufacturing the nitride semiconductor laser according to Embodiment 1.

Next, as illustrated in FIG. 2K, spaces 70 are formed by removing second protection film 92 present between electrode component 50 and dielectric layer 60. For example, when second protection film 92 is a resist, second protection film 92 is removed by using an organic solvent such as acetone as a removing liquid for removing second protection film 92. In this case, only second protection film 92 is removed by causing the organic solvent (removing liquid) to penetrate from the end portion in the longitudinal direction of second nitride semiconductor layer 40, where pad electrode 52 is not formed. By forming spaces 70 between pad electrode 52 and dielectric layer 60 as described above, pad electrode 52 and dielectric layer 60 can be brought to a non-contact state.

It should be noted that when second protection film 92 is a non-organic film such as AlN, second protection film 92 can be removed by using an alkali solution as a removing liquid for removing second protection film 92.

Figure 2L:
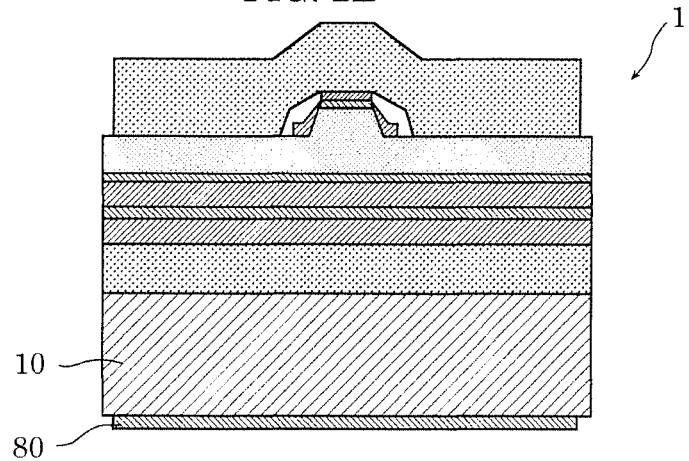
FIG. 2L is a cross-sectional view illustrating a process of forming an n-side electrode in the method of manufacturing the nitride semiconductor laser according to Embodiment 1.

Next, as illustrated in FIG. 2L, n-side electrode 80 is formed on the lower surface of substrate 10. Specifically, n-side electrode 80 including Ti/Pt/Au is formed on the lower surface of substrate 10 by vacuum evaporation, etc., and then patterned by photolithography and etching to form n-side electrode 80 in a predetermined shape. Accordingly, nitride semiconductor laser 1 according to this embodiment can be manufactured.

[Mounting Aspect of Nitride Semiconductor Laser]

Figure 3:
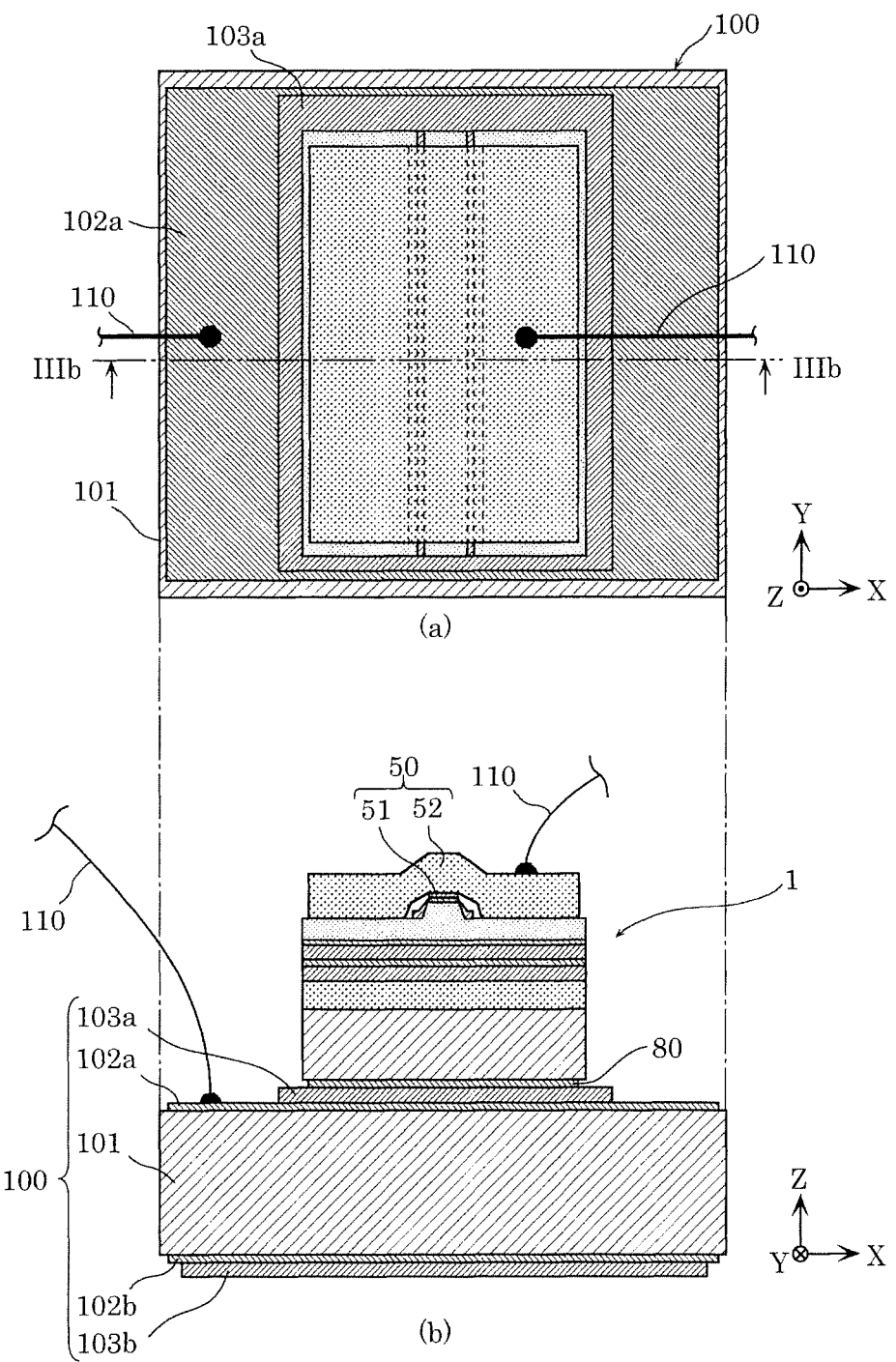
FIG. 3 is a diagram for describing a mounting aspect of the nitride semiconductor laser according to Embodiment 1.

Next, the mounting aspect of nitride semiconductor laser 1 according to Embodiment 1 will be described with reference to FIG. 3. FIG. 3 is a diagram for describing the mounting aspect of nitride semiconductor laser 1 according to Embodiment 1. Here, (a) in FIG. 3 is a plan view of the mounting aspect of nitride semiconductor laser 1, and (b) in FIG. 3 is a cross-sectional view of the mounting aspect of nitride semiconductor laser 1 taken along line IIIb-IIIb in (a) in FIG. 3.

As illustrated in (a) and (b) in FIG. 3, submount 100 includes base 101, first electrode 102a, second electrode 102b, first solder layer 103a, and second solder layer 103b.

The material of base 101 is not particularly limited, and it is sufficient that base 101 is formed from a material having an equivalent or higher thermal conductivity compared to nitride semiconductor laser 1, such as a ceramic such as aluminum nitride (AlN) or silicon carbide (SiC), diamond (C) formed by CVD, a simple metal such as Cu or Al, or an alloy such as CuW.

First electrode 102a is formed on one surface of base 101. Furthermore, second electrode 102b is formed on the other surface of base 101. First electrode 102a and second electrode 102b are multilayer films including metal such as Ti (0.1 μm), Pt (0.2 μm), and Au (0.2 μm), for example.

First solder layer 103a is formed on first electrode 102a. Second solder layer 103b is formed beneath second electrode 102b. Each of first solder layer 103a and second solder layer 103b is an eutectic solder including a gold-tin alloy consisting of Au (70%) and Sn (30%), for example.

Nitride semiconductor laser 1 is mounted on submount 100. In other words, submount 100 holds nitride semiconductor laser 1. In this embodiment, since a mounting aspect in which the n-side of nitride semiconductor laser 1 is connected to submount 100, that is, junction-up mounting, is adopted, n-side electrode 80 of nitride semiconductor laser 1 is connected to first solder layer 103a of submount 100.

Furthermore, wires 110 are connected to pad electrode 52 of nitride semiconductor laser 1 and first electrode 102a of submount 100 by wire bonding. Accordingly, current can be supplied to nitride semiconductor laser 1 through wires 110.

It should be noted that, although not illustrated in the figure, submount 100 is mounted on a metal package such as a CAN package, for example, for the purpose of improving heat-dissipation and simplifying handling.

Furthermore, although the case where nitride semiconductor laser 1 is junction-up mounted is described in this embodiment, the mounting aspect in which the p-side of nitride semiconductor laser 1 is connected to submount 100, that is, junction-down mounting, may be applied. In this manner, when nitride semiconductor laser 1 is junction-down mounted, the p-side which is close to the heat source is connected to submount 100, and thus the heat-dissipation performance of nitride semiconductor laser 1 can be improved.

[Effects of Nitride Semiconductor Laser]

Figure 4A:
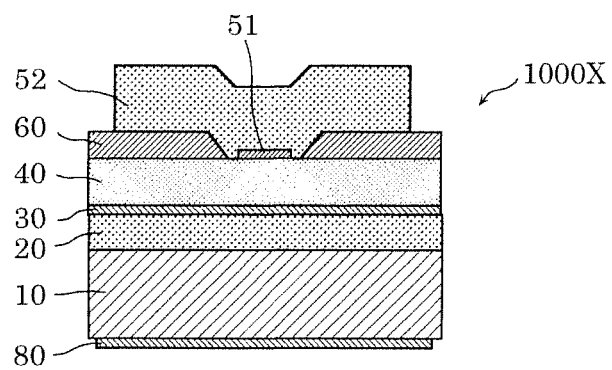
FIG. 4A is a cross-sectional view of a laser structure simulating a nitride semiconductor laser according to a comparative example.
Figure 4B:
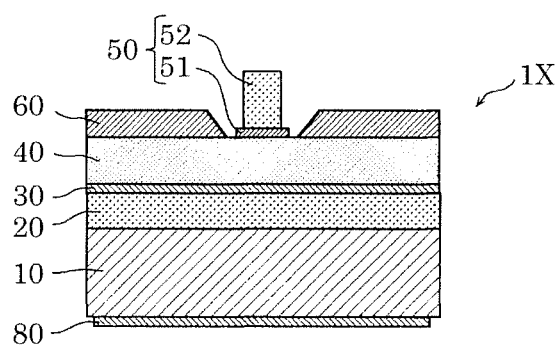
FIG. 4B is a cross-sectional view of a laser structure simulating the nitride semiconductor laser according to Embodiment 1.
Figure 4C:
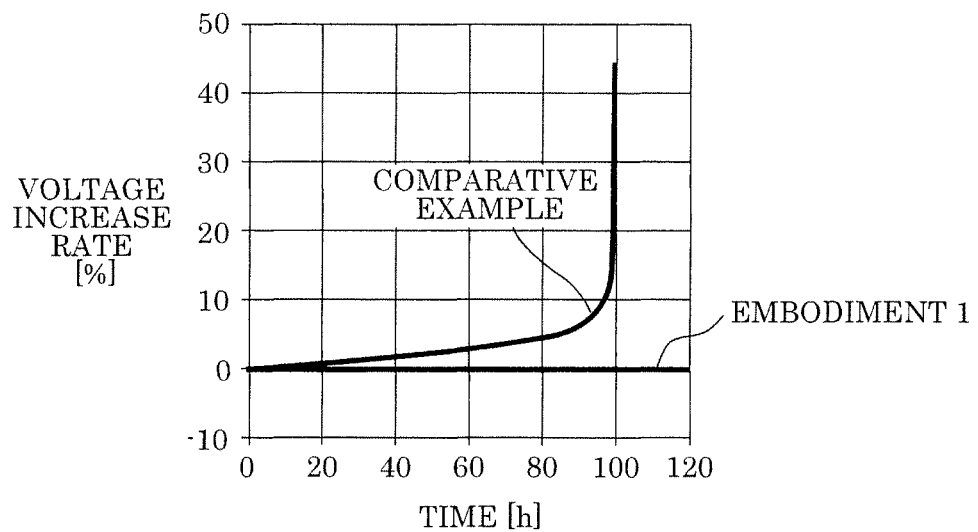
FIG. 4C is a diagram illustrating change over time of the operating voltages of the comparative example and the laser structure according Embodiment 1.

Next, the effects of nitride semiconductor laser 1 according to this embodiment, including the circumstances leading to the obtainment of the technique of the present disclosure, will be described with reference to FIG. 4A, FIG. 4B, and FIG. 4C. FIG. 4A is a cross-sectional view of laser structure 1000X simulating a nitride semiconductor laser according to a comparative example. FIG. 4B is a cross-sectional view of laser structure 1X simulating nitride semiconductor laser 1 according to Embodiment 1. FIG. 4C is a diagram comparing changes over time of the operational voltages of laser structure 1000X according to the comparative example and laser structure 1X according Embodiment 1.

Table 1 below shows dielectric materials widely used for semiconductor devices. In particular, $SiO_2$ has the lowest refractive index and is transparent with respect to light. Because of this, $SiO_2$ is useful as an insulating film of a semiconductor laser.

TABLE 1

| Dielectric Material | Refractive Index |
| --- | --- |
| $SiO_2$ | 1.47 |
| $Al_2O_3$ | 1.79 |
| $TiO_2$ | 2.04 |
| SiN | 2.07 |
| AlN | 2.19 |
| $ZrO_2$ | 2.27 |
| TiN | 2.64 |

In the development of nitride semiconductor lasers, however, the problem of operating voltage increasing during continuous energization due to the $SiO_2$ used as an insulating film in the semiconductor laser was found.

In order to identify the cause, as illustrated in FIG. 4A and FIG. 4B, laser structures 1000X and 1X simulating nitride semiconductor lasers were actually prepared, and an energization experiment was conducted. It should be noted that, in order to verify voltage changes caused by energization of the nitride semiconductor lasers, ridge portions which contribute to confining light were not formed in the experiment, but the same results can be obtained even in a configuration having a ridge portion.

As illustrated in FIG. 4A, laser structure (laser structure according to the comparative example) 1000X simulating the nitride semiconductor laser according to the comparative example includes substrate 10 which is a GaN substrate; first nitride semiconductor layer 20 which is an n-side AlGaN cladding layer; light-emitting layer 30 including an n-side GaN light guide layer, an InGaN active layer, and a p-side GaN light guide layer; and second nitride semiconductor layer 40 including an AlGaN electron barrier layer, a p-side AlGaN cladding layer, and a p-side GaN contact layer. In addition, dielectric layer 60 including $SiO_2$ is stacked on second nitride semiconductor layer 40. Furthermore, dielectric layer 60 includes an opening, and p-side electrode 51 including Pd/Pt is formed in the opening. In addition, pad electrode 52 including Ti/Pt/Au is formed to cover p-side electrode 51 and dielectric layer 60. It should be noted that n-side electrode 80 is formed on the lower surface of substrate 10.

Furthermore, as illustrated in FIG. 4B, laser structure (laser structure according to Embodiment 1) 1X simulating the nitride semiconductor laser according to Embodiment 1 includes, as with laser structure 1000X according to the comparative example, substrate 10 which is a GaN substrate; first nitride semiconductor layer 20 which is an n-side AlGaN cladding layer; light-emitting layer 30 including an n-side GaN light guide layer, an InGaN active layer, and a p-side GaN light guide layer; second nitride semiconductor layer 40 including an AlGaN electron barrier layer, a p-side AlGaN cladding layer, and a p-side GaN contact layer; and n-side electrode 80. In addition, dielectric layer 60 including $SiO_2$ is stacked on second nitride semiconductor layer 40. Furthermore, dielectric layer 60 includes an opening, and p-side electrode 51 including Pd/Pt is formed in the opening. In addition, unlike laser structure 1000X according to the comparative example, in laser structure 1X according to Embodiment 1, pad electrode 52 including Ti/Pt/Au is formed only on p-side electrode 51, and pad electrode 52 and dielectric layer 60 are not in contact with each other. Pad electrode 52 is formed in an inner portion of the upper surface of p-side electrode 51.

When laser structure 1000X according to the comparative example (FIG. 4A) and laser structure 1X according to Embodiment 1 (FIG. 4B) prepared in the above manner were continuously energized, the results shown in FIG. 4C were obtained with regard to operating voltage.

As illustrated in FIG. 4C, in laser structure 1000X according to the comparative example, it was found that the operating voltage gradually increased with energization time, and that the operating voltage rapidly increased when the energization time exceeded 100 hours. On the other hand, in laser structure 1X according to Embodiment 1, it was found that the operating voltage hardly increased even after a long period of time elapsed, and that the increase of operating voltage was significantly prevented, compared to laser structure 1000X according to the comparative example.

As a result of careful consideration of the test results by the inventors of the present application, it was found that, since $SiO_2$ is a material containing a large amount of hydrogen, diffusion of the hydrogen contained in dielectric layer 60 to p-side electrode 51 and pad electrode 52 that had occurred during operation caused an increase in the operating voltage in laser structure 1000X according to the comparative example.

On the other hand, it is considered that in laser structure 1X according to Embodiment 1, dielectric layer 60 which includes $SiO_2$ and electrode component 50 (p-side electrode 51 and pad electrode 52) are not in contact with each other, and thus the operating voltage did not increase because the hydrogen contained in dielectric layer 60 did not diffuse to electrode component 50.

Furthermore, as a result of considering the reason why the $SiO_2$ included in dielectric layer 60 contained hydrogen, it was found that dielectric layer 60 contained hydrogen because the hydrogen in the material (silane ($SiH_4$)) used in the $SiO_2$ film-forming remained in the $SiO_2$ film, or hydrogen was left in the $SiO_2$ film by the water cleansing performed in the manufacturing process such as photolithography or etching.

The technique of the present disclosure is developed based on the knowledge described above, and by preventing hydrogen contained in dielectric layer 60 from diffusing to electrode component 50, an increase in the operating voltage is reduced even when $SiO_2$ is used as dielectric layer 60.

Specifically, as illustrated in FIG. 1, in nitride semiconductor laser 1 according to Embodiment 1, spaces 70 are interposed between electrode component 50 and dielectric layer 60 so that electrode component 50 and dielectric layer 60 are not in contact with each other. Specifically, pad electrode 52 and dielectric layer 60 are kept from coming into contact with each other.

Accordingly, since the transfer pathway of hydrogen from dielectric layer 60 to electrode component 50 is blocked by spaces 70, diffusion of hydrogen contained in dielectric layer 60 to electrode component 50 can be prevented. As a result, an increase in the operating voltage caused by hydrogen can be reduced.

It should be noted that although contact between dielectric layer 60 and pad electrode 52 is completely avoided in this embodiment in order to maximize the reduction effect on hydrogen diffusion from dielectric layer 60 to electrode component 50, even if dielectric layer 60 and pad electrode 52 are in partial contact due to manufacturing irregularity, as long as the contact area is sufficiently small, there is only a slight impact on the operating voltage, and an increase in the operating voltage can be reduced.

Furthermore, since spaces 70 formed near ridge portion 40a consist of the atmospheric gas (for example, air) at the time of packaging, thermal conductivity is low. Although having a noticeable impact in a junction-down mounting in which the p-side is connected to submount 100, as a result of consideration, it was found that the thermal conductivity of spaces 70 has almost no impact when the height of ridge portion 40a is at most 1 μm and the width of ridge portion 40a is at least 10 μm. This is believed to be because when the width of ridge portion 40a is sufficiently great relative to the height of ridge portion 40a, heat generated by light-emitting layer 30 is dissipated to submount 100 from ridge portion 40a via electrode component 50.

Furthermore, in nitride semiconductor laser 1 according to this embodiment, pad electrode 52 is in contact not only with ridge portion 40a via p-side electrode 51, but also with planar portions 40b. Here, current injection from pad electrode 52 to p-side cladding layer 42 will be described below.

In nitride semiconductor laser 1, as a structure for contact-connecting to the p-side, p-side contact layer 43 is formed on ridge portion 40a as a layer whose doping concentration is intentionally made high. Then, ohmic contact is realized by bringing p-side electrode 51 including Pd, Pt, or Ni having high which work function into contact with p-side contact layer 43.

On the other hand, p-side contact layer 43 is not present on planar portions 40b disposed lateral to ridge portion 40a, and thus there is no ohmic contact. Furthermore, there are cases where the surface of p-side cladding layer 42 changes to the n type due to damage caused by nitrogen (N) loss that occurs when forming ridge portion 40a, and ohmic contact on planar portions 40b is difficult. In addition, since Ti having a low work function is used as the material of pad electrode 52 in this embodiment, ohmic contact becomes more difficult.

In this manner, in nitride semiconductor laser 1 according to this embodiment, ohmic contact is realized on ridge portion 40a whereas a Schottky contact is realized on planar portions 40b. Because of this, current supply from pad electrode 52 to second nitride semiconductor layer 40 is reduced. Specifically, with regard to the current supply from pad electrode 52 to second nitride semiconductor layer 40, current is supplied only from ridge portion 40a and current is not supplied from planar portions 40b. It should be noted that the current supply from planar portions 40b may be prevented by intentionally causing the portion of p-side cladding layer 42 which is the contact portion between pad electrode 52 and planar portions 40b to have a high resistance.

SUMMARY

As described above, nitride semiconductor laser 1 according to this embodiment includes: first nitride semiconductor layer 20; light-emitting layer 30 formed on first nitride semiconductor layer 20 and including a nitride semiconductor; second nitride semiconductor layer 40 formed on light-emitting layer 30 and having ridge portion 40a; electrode component 50 formed on second nitride semiconductor layer 40 and which is wider than ridge portion 40a; and dielectric layer 60 formed on side surfaces of ridge portion 40a and including $SiO_2$. In addition, spaces 70 are formed between electrode component 50 and dielectric layer 60, and electrode component 50 is prevented from being in contact with dielectric layer 60 by spaces 70, and is in contact with the upper surface of ridge portion 40a.

As described above, electrode component 50 and dielectric layer 60 are prevented from being in contact with each other by spaces 70 formed between electrode component 50 and dielectric layer 60. Accordingly, diffusion of hydrogen contained in dielectric layer 60 to electrode component 50 can be prevented. Therefore, an increase in the operating voltage caused by hydrogen can be reduced.

Furthermore, in nitride semiconductor laser 1 according to this embodiment, second nitride semiconductor layer 40 has planar portions 40b disposed lateral to ridge portion 40a, electrode component 50 includes p-side electrode 51, which is an ohmic electrode, and pad electrode 52 formed on p-side electrode 51 (i.e., the ohmic electrode). In addition, p-side electrode 51 is in contact with the upper surface of ridge portion 40a, and pad electrode 52 is wider than ridge portion 40a and is in contact with the upper surfaces of planar portions 40b.

According to this configuration, the drive current of nitride semiconductor laser 1 flows through p-side electrode 51, which is an ohmic electrode, to ridge unit 40a. Furthermore, since pad electrode 52 is formed widely even up to planar portions 40b, electrical connection by wire bonding, etc., becomes easy.

Furthermore, in nitride semiconductor laser 1 according to this embodiment, second nitride semiconductor layer 40 includes p-side contact layer 43 formed as the top layer of ridge portion 40a, and p-side electrode 51 (i.e., the ohmic electrode) is in contact with the upper surface of p-side contact layer 43, which is the upper surface of ridge portion 40a.

According to this configuration, since p-side electrode 51 (i.e., the ohmic electrode) and ridge portion 40a are in a good state of ohmic contact, current is satisfactorily supplied to ridge portion 40a.

Furthermore, in nitride semiconductor laser 1 according to this embodiment, ridge portion 40a may have a width of at least 10 μm and at most 50 μm.

According to this configuration, a nitride semiconductor laser capable of being operated at a high light output can be realized.

Embodiment 2

Figure 5:
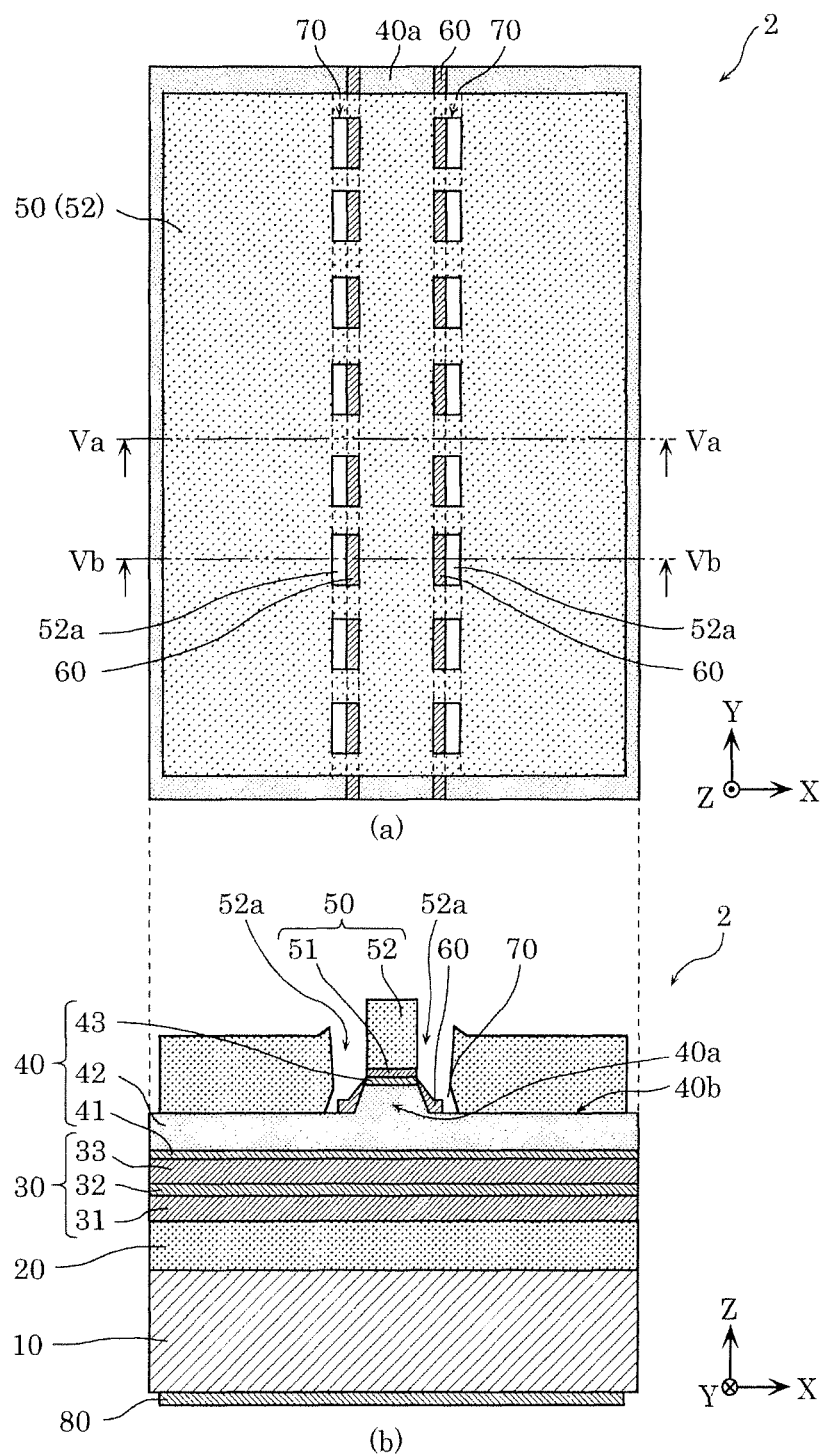
FIG. 5 is a diagram illustrating a configuration of a nitride semiconductor laser according to Embodiment 2.

Next, nitride semiconductor laser 2 according to Embodiment 2 will be described with reference to FIG. 5. FIG. 5 is a diagram illustrating a configuration of nitride semiconductor laser 2 according to Embodiment 2. Here, (a) in FIG. 5 is a plan view of nitride semiconductor laser 2, and (b) in FIG. 5 is a cross-sectional view of nitride semiconductor laser 2 taken along the line Vb-Vb in (a) in FIG. 5. It should be noted that the cross-sectional view of nitride semiconductor laser 2 taken along line Va-Va in (a) in FIG. 5 is the same as the cross-sectional view in (b) in FIG. 1.

As illustrated in (a) and (b) in FIG. 5, nitride semiconductor laser 2 according to this embodiment is different from nitride semiconductor laser 1 according to Embodiment 1 in the configuration of electrode component 50. Specifically, nitride semiconductor laser 2 according to this embodiment has a configuration obtained by forming openings 52a in pad electrode 52 of electrode component 50 in nitride semiconductor laser 1 according to Embodiment 1. Specifically, pad electrode 52 has regions in which pad electrode 52 is not formed.

Openings 52a communicate with spaces 70. Furthermore, openings 52a are formed near ridge portion 40a. Specifically, in a plan view, openings 52a are formed such that spaces 70 which are regions inside of pad electrode 52 and the space which is the region outside of pad electrode 52 communicate with each other at positions overlapping with dielectric layer 60.

In this embodiment, a plurality of openings 52a are formed. Specifically, in a plan view, openings 52a are formed on both sides of ridge portion 40a, intermittently along the stripe direction of ridge 40a.

As described above, in nitride semiconductor laser 2, openings 52a are formed in pad electrode 52. Accordingly, stress exerted on ridge portion 40a can be reduced, and thus peeling-off of pad electrode 52 can be reduced. Accordingly, an increase in the operating voltage caused by the peeling-off of pad electrode 52, etc. can be reduced.

Furthermore, in nitride semiconductor laser 2, pad electrode 52 is spatially separated by openings 52a into the portion above ridge portion 40a and the portions on planar portions 40b in the cross-sectional view taken along line Vb-Vb in (a) in FIG. 5. However, in the cross-sectional view taken along line Va-Va in (a) in FIG. 5, openings 52a are not formed in pad electrode 52 and pad electrode 52 continues above ridge portion 40a and on planar portions 40b.

According to this configuration, even when a wire for supplying current is connected to pad electrode 52 at a portion other than above ridge portion 40a (i.e., at a portion above planar portions 40bs 40b), current can be supplied to ridge portion 40a because pad electrode 52 continues above ridge portion 40a. Therefore, since the wire can be bonded to pad electrode 52 at a portion other than the portion above ridge portion 40a, element deterioration caused by wire bonding can be reduced.

Figure 6:
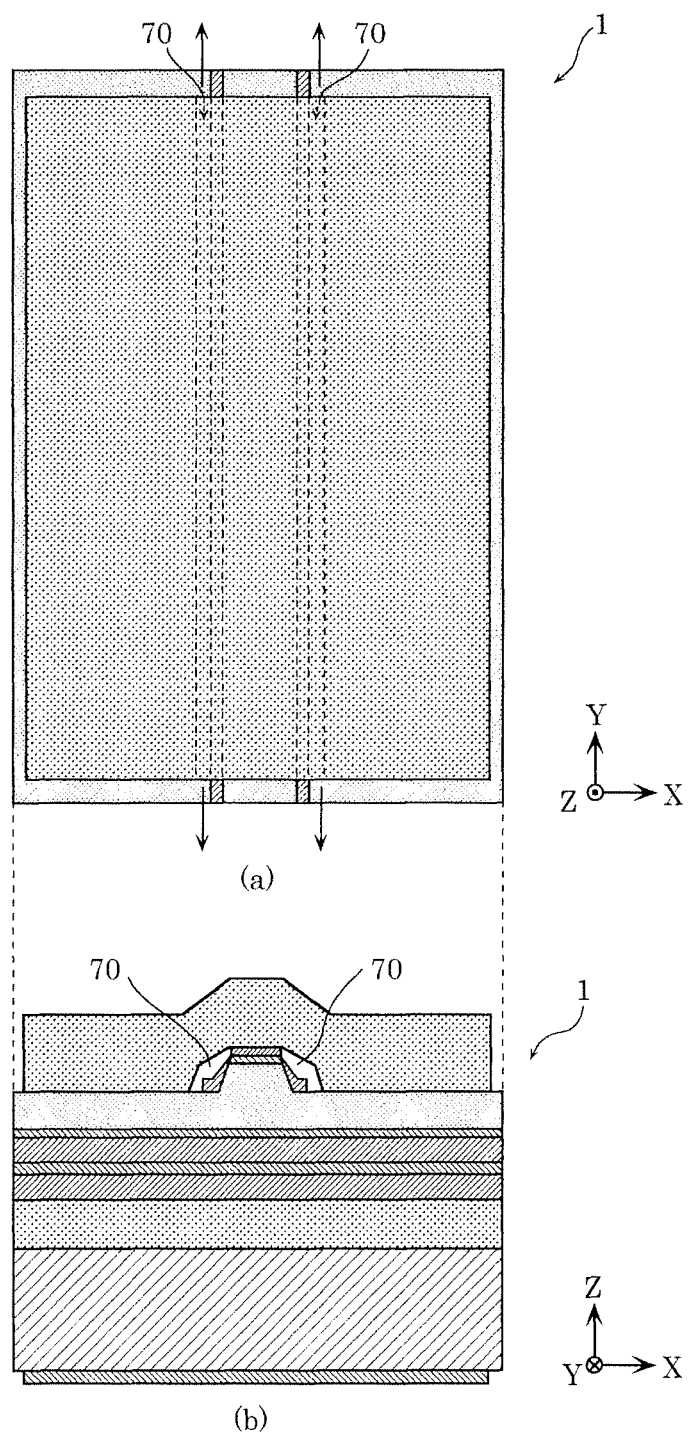
FIG. 6 is a diagram illustrating a process of forming spaces in the method of manufacturing the nitride semiconductor laser according to Embodiment 1.
Figure 7:
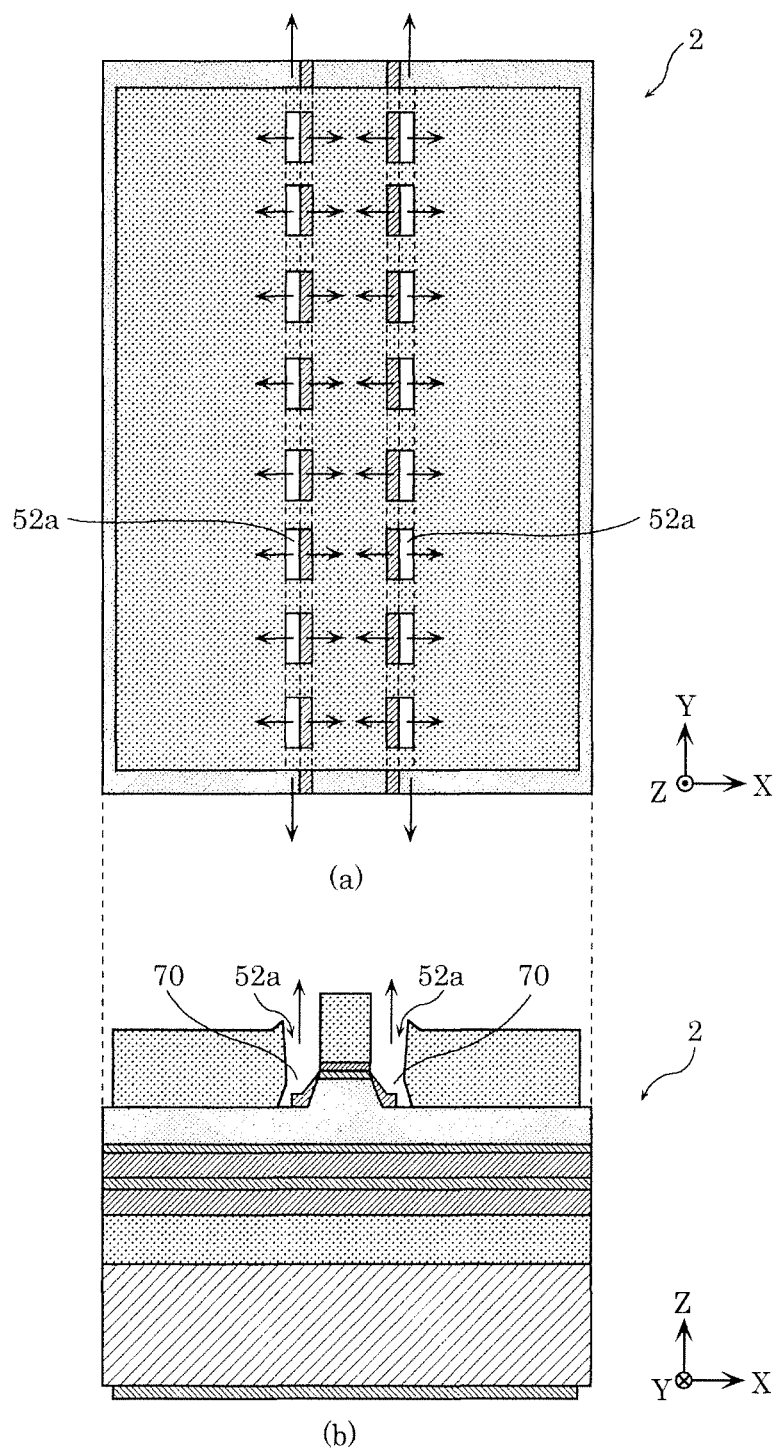
FIG. 7 is a diagram illustrating a process of forming spaces in the method of manufacturing the nitride semiconductor laser according to Embodiment 2.

In addition, by forming openings 52a through pad electrode 52, the time required for forming spaces 70 can be reduced. This point will be described with reference to FIG. 6 and FIG. 7. FIG. 6 is a diagram illustrating a process for forming spaces 70 by removing second protection film 92 in the method of manufacturing nitride semiconductor laser 1 according to Embodiment 1 illustrated in FIG. 1. FIG. 7 is a diagram illustrating a process of forming spaces 70 by removing second protection film 92 in the method of manufacturing nitride semiconductor laser 2 according to Embodiment 2.

Nitride semiconductor laser 2 according to this embodiment can be manufactured with the same method as with nitride semiconductor laser 1 according to Embodiment 1 described with reference to FIG. 2A to 2L.

Specifically, in FIG. 2J, pad electrode 52 including openings 52a can be formed by forming pad electrode 52 by lift-off. Subsequently, as illustrated in FIG. 2K, spaces 70 can be formed by removing second protection film 92 which is present between electrode component 50 and dielectric layer 60.

In this case, as illustrated in FIG. 6, in nitride semiconductor laser 1 according to Embodiment 1, openings 52a are not formed in pad electrode 52. Because of this, in the process of removing second protection film 92 which is present between electrode component 50 and dielectric layer 60 (process in FIG. 2K), the removing liquid for removing second protection film 92 flows in the arrow directions illustrated in FIG. 6. In other words, the removing liquid flows only in the stripe direction (the Y-axis direction) of ridge portion 40a.

On the other hand, as illustrated in FIG. 7, in nitride semiconductor laser 2 according to this embodiment, openings 52a are formed in pad electrode 52. Because of this, in the process of removing second protection film 92 which is present between electrode component 50 and dielectric layer 60 (process in FIG. 2K), the removing liquid for removing second protection film 92 flows not only in the stripe direction (the Y-axis direction) of ridge portion 40a but also in the protruding direction (the Z-axis direction) of ridge portion 40a, as illustrated by arrows in FIG. 7.

Therefore, the pathways of the removing liquid for removing second protection film 92 can be increased in this embodiment compared to Embodiment 1, and thus second protection film 92 can be removed in a short time. Therefore, the manufacturing time of nitride semiconductor laser 2 can be reduced compared to Embodiment 1.

In addition, the removing liquid for removing second protection film 92 not only flows in the stripe direction (the Y-axis direction) of ridge portion 40a, but, along the way, also flows in a direction (the Z-axis direction) crossing the stripe direction and, in addition, flows out through the plurality of openings 52a. Accordingly, the residue of second protection film 92 left in spaces 70 due to process irregularity, etc., can be eliminated. Therefore, a reliable nitride semiconductor laser 2 can be realized.

Figure 8:
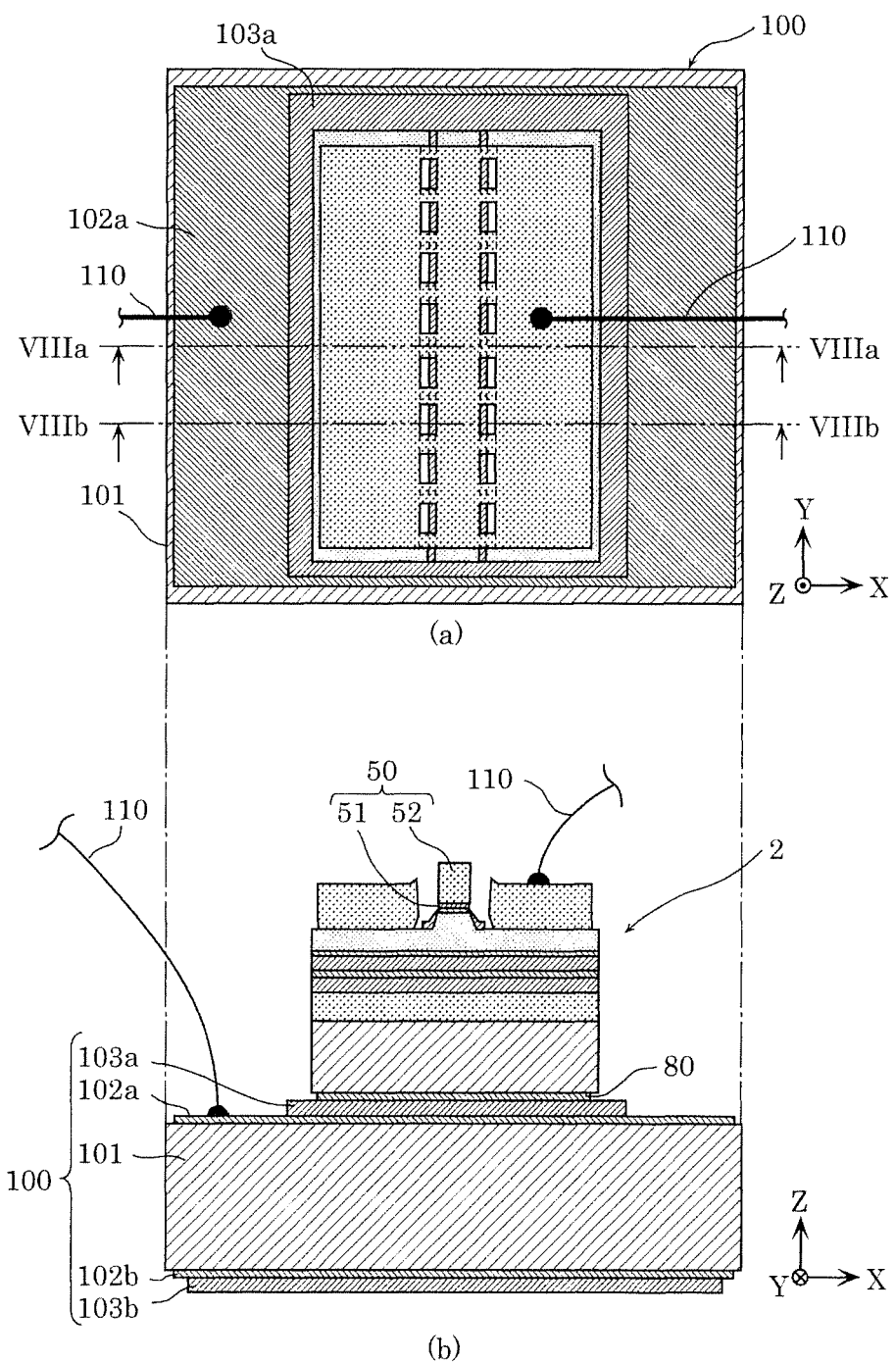
FIG. 8 is a diagram for describing a mounting aspect of the nitride semiconductor laser according to Embodiment 2.

Next, the mounting aspect of nitride semiconductor laser 2 according to Embodiment 2 will be described with reference to FIG. 8. FIG. 8 is a diagram for describing the mounting aspect of nitride semiconductor laser 2 according to Embodiment 2. Here, (a) in FIG. 8 is a plan view of the mounting aspect of nitride semiconductor laser 2, and (b) in FIG. 8 is a cross-sectional view of the mounting aspect of nitride semiconductor laser 2 taken along line VIIIb-VIIIb in (a) in FIG. 8.

As illustrated in FIG. 8, in this embodiment too, nitride semiconductor laser 2 can be mounted using the same submount 100 as in Embodiment 1.

Furthermore, in this embodiment too, since junction-up mounting in which the n-side of nitride semiconductor laser 2 is connected to submount 100 is adopted, n-side electrode 80 of nitride semiconductor laser 2 is connected to first solder layer 103a of submount 100.

Furthermore, in this embodiment too, wires 110 are each connected to pad electrode 52 of nitride semiconductor laser 2 and first electrode 102a of submount 100, in the same manner as in Embodiment 1. Accordingly, current can be supplied to nitride semiconductor laser 2 by wires 110.

It should be noted that nitride semiconductor laser 2 may be junction-down mounted instead of being junction-up mounted.

As described above, the same effect as Embodiment 1 can be obtained by nitride semiconductor laser 2 according to this embodiment. For example, in this embodiment too, since electrode component 50 and dielectric layer 60 are prevented from being in contact with each other by spaces 70 formed between electrode component 50 and dielectric layer 60, the effect that an increase in the operating voltage with energization time can be reduced, for example, can be obtained.

Furthermore, compared to nitride semiconductor laser 1 according to Embodiment 1, in this embodiment, pad electrode 52 further includes openings 52a which communicate with spaces 70.

Accordingly, since peeling-off of pad electrode 52, etc., can be reduced, an increase in the operating voltage can be further reduced. Furthermore, since the pathways of the removing liquid for removing second protection film 92 are increased by forming openings 52a through pad electrodes 52, second protection film 92 can be removed in a shorter time and the manufacturing time of nitride semiconductor laser 2 can be reduced. In addition, since the residue of second protection film 92 in spaces 70 can be eliminated by forming opening 52a through pad electrode 52, a reliable nitride semiconductor laser 2 can be realized.

Embodiment 3

Figure 9:
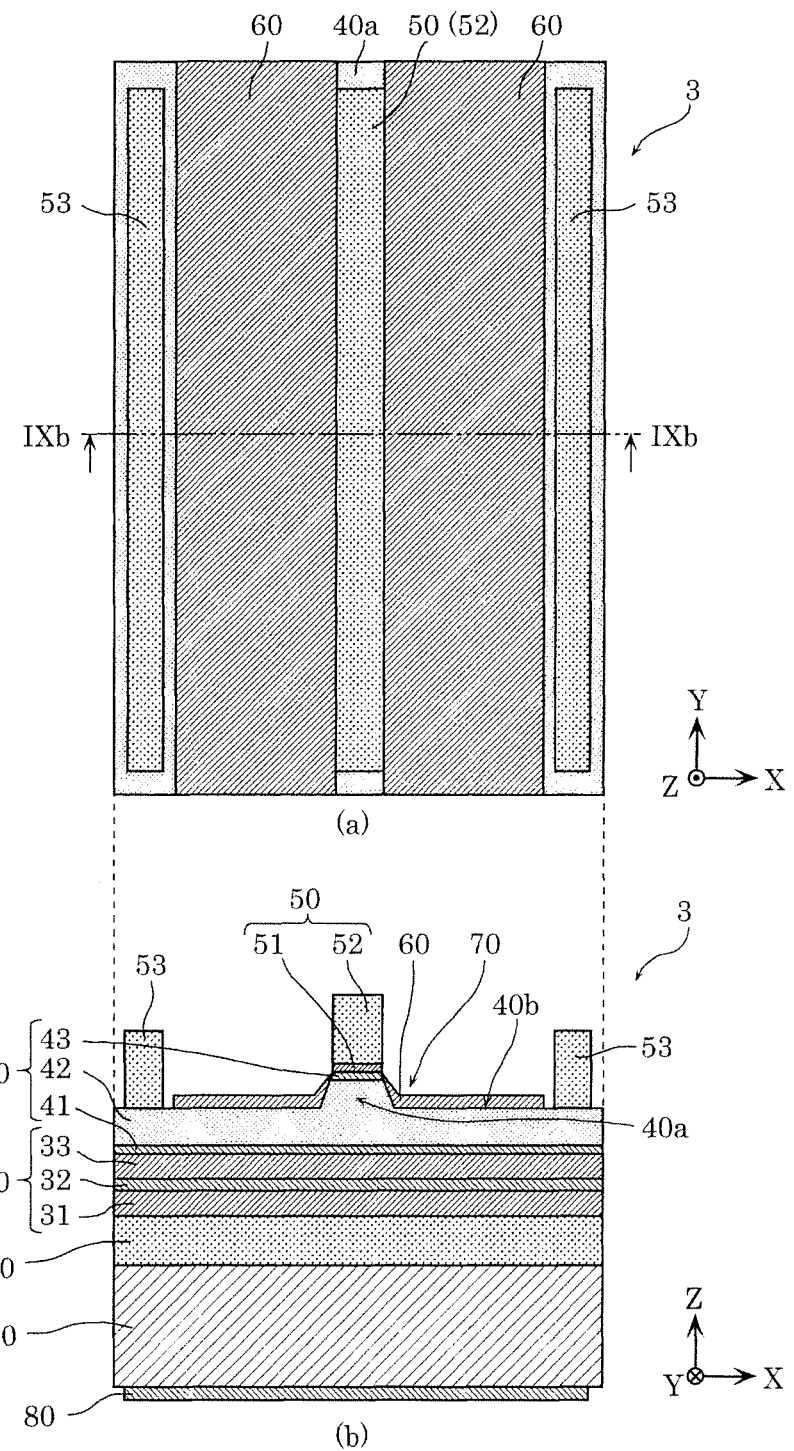
FIG. 9 is a diagram illustrating a configuration of a nitride semiconductor laser according to Embodiment 3.

Next, nitride semiconductor laser 3 according to Embodiment 3 will be described with reference to FIG. 9. FIG. 9 is a diagram illustrating the configuration of nitride semiconductor laser 3 according to Embodiment 3. Here, (a) in FIG. 9 is a plan view of nitride semiconductor laser 3, and (b) in FIG. 9 is a cross-sectional view of nitride semiconductor laser 3 taken along line IXb-IXb in (a) in FIG. 9.

As illustrated in (a) and (b) in FIG. 9, nitride semiconductor laser 3 according to this embodiment is different from nitride semiconductor laser 1 according to Embodiment 1 in the configuration of electrode component 50. Specifically, nitride semiconductor laser 3 according to this embodiment has the configuration obtained by completely separating electrode component 50 between the portion above ridge portion 40a and the portions on planar portions 40b in nitride semiconductor laser 1 according to Embodiment 1. Specifically, in nitride semiconductor laser 3 according to this embodiment, the component above ridge portion 40a functions as electrode component 50 for supplying current, and the components on planar portions 40b include the same material as electrode component 50 but function as pad components 53 which do not supply current. Pad components 53 are in contact with the upper surface of planar portions 40bs 40b, but is not in contact with dielectric layer 60.

In this embodiment too, electrode component 50 is not in contact with dielectric layer 60, and is in contact with the upper surface of ridge portion 40a. Specifically, electrode component 50 includes p-side electrode 51 which is in contact with the upper surface of ridge portion 40a and is formed only above ridge portion 40a, and pad electrode 52 which is in contact with the upper surface of p-side electrode 51 and is formed only on p-side electrode 51. In other words, unlike pad electrode 52 according to Embodiment 1, pad electrode 52 according to this embodiment is formed only above ridge portion 40a and is not wider than ridge portion 40a. Furthermore, pad electrode 52 according to this embodiment is stripe shaped and extends in the Y-axis direction.

It should be noted that, in this embodiment too, spaces 70 are formed between electrode component 50 and dielectric layer 60, and electrode component 50 is formed so as to be prevented from being in contact with dielectric layer 60 by spaces 70. Specifically, pad electrode 52 and dielectric layer 60 are prevented from being in contact with each other by spaces 70.

Pad components 53 include the same material as pad electrode 52 included in electrode component 50. In this embodiment, two pad components 53 are formed. The two pad components 53 are formed with ridge portion 40a as a midpoint. Pad components 53 extend along the stripe direction (the Y-axis direction) of ridge portion 40a so as to be parallel to ridge portion 40a. Pad components 53 are prevented from being in contact with dielectric layer 60 by spaces 70.

It should be noted that, in this embodiment, dielectric layer 60 is formed not only on the side surfaces of ridge portion 40a, but is formed from the side surfaces of ridge portion 40a and covering the upper surface of planar portions 40b up to the vicinity of pad components 53.

Figure 10:
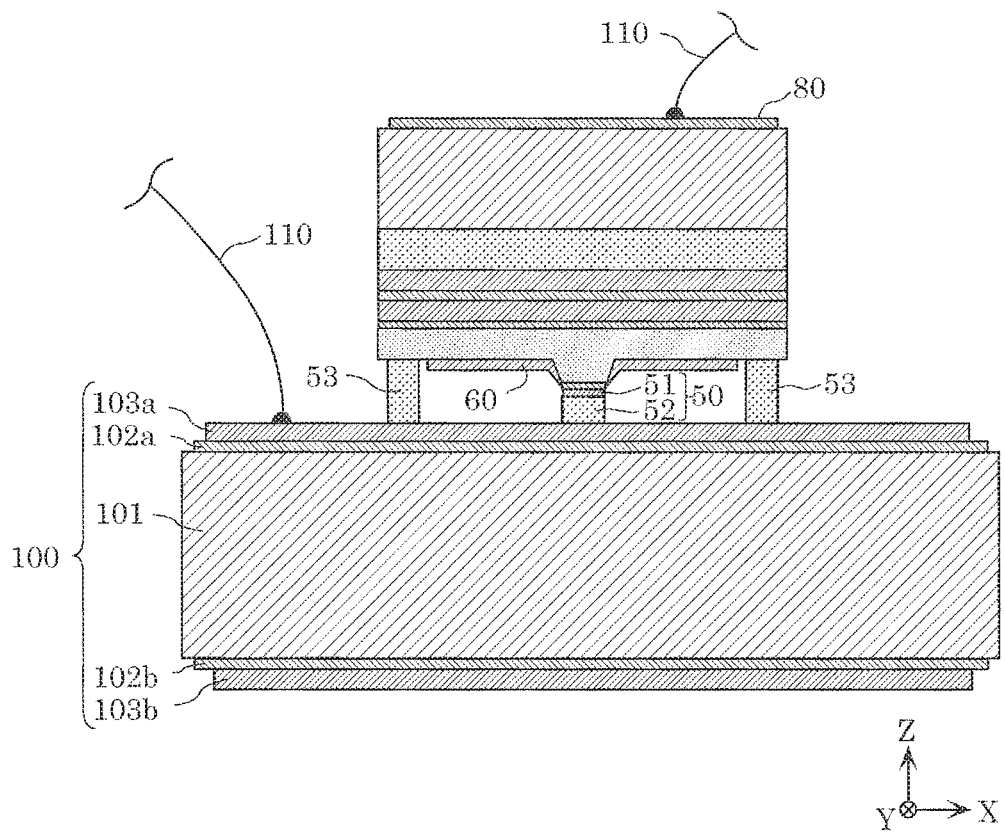
FIG. 10 is a cross-sectional view illustrating a mounting aspect of the nitride semiconductor laser according to Embodiment 3.
Figure 11:
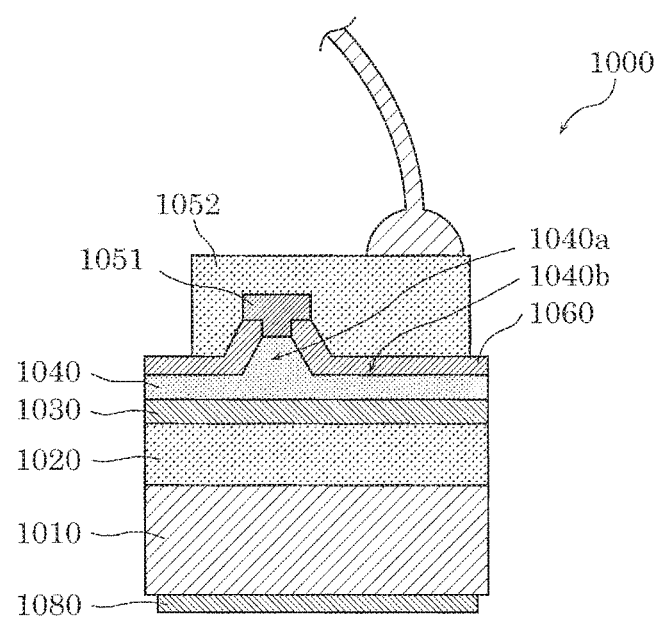
FIG. 11 is a cross-sectional view of a conventional nitride semiconductor laser.

Next, the mounting aspect of nitride semiconductor laser 3 according to Embodiment 3 will be described with reference to FIG. 10. FIG. 10 is a cross-sectional view of the mounting aspect of nitride semiconductor laser 3 according to Embodiment 3.

As illustrated in FIG. 10, in this embodiment, nitride semiconductor laser 3 is also mounted on the same submount 100 as in Embodiment 1. However, unlike in Embodiment 1, in this embodiment, a mounting aspect in which the p-side of nitride semiconductor laser 3 is connected to submount 100, that is, a junction-down mounting, is adopted, and thus electrode component 50 of nitride semiconductor laser 3 is connected to first solder layer 103a of submount 100.

In this manner, by adopting the junction-down mounting, heat generated in light-emitting layer 30 and second nitride semiconductor layer 40 can be efficiently dissipated to submount 100.

Furthermore, in this embodiment, pad components 53 are also connected to first solder layer 103a of submount 100. At this time, pad components 53 function as a supporting component which supports nitride semiconductor laser 3. In other words, nitride semiconductor laser 3 can be stably mounted by providing pad components 53.

It should be noted that, although pad components 53 include the same material as pad electrode 52, that is, a conductive material, pad components 53 and planar portions 40b are in Schottky contact with each other. Because of this, current supply from pad electrodes 53 to second nitride semiconductor layer 40 (p-side cladding layer 42) is prevented. Specifically, current which flows through wire 110 to first solder layer 103a is supplied to second nitride semiconductor layer 40 only via electrode component 50, and is not supplied to second nitride semiconductor layer 40 via pad components 53.

It should be noted that instead of junction-down mounting nitride semiconductor laser 3, nitride semiconductor laser 3 may be junction-up mounted.

Furthermore, nitride semiconductor laser 3 according to this embodiment can be manufactured according to the method of manufacturing nitride semiconductor laser 2 according to Embodiment 2. Specifically, in the process of forming pad electrode 52, it is sufficient to form a single stripe-shaped pad electrode 52 and two stripe-shaped pad components 53 by lift-off.

As described above, nitride semiconductor laser 3 according to this embodiment includes: first nitride semiconductor layer 20; light-emitting layer 30 formed on first nitride semiconductor layer 20 and including a nitride semiconductor; second nitride semiconductor layer 40 formed on light-emitting layer 30 and having ridge portion 40a; electrode component 50 formed on second nitride semiconductor layer 40; dielectric layer 60 formed on side surfaces of ridge portion 40a and including $SiO_2$; and pad components 53 formed on second nitride semiconductor layer 40 and including the same material as the material of electrode component 50. In addition, pad components 53 are not in contact with dielectric layer 60, and electrode component 50 is not in contact with dielectric layer 60, and is in contact with the upper surface of ridge portion 40a.

Accordingly, diffusion of hydrogen contained in dielectric layer 60 to electrode component 50 can be prevented. Therefore, an increase in the operating voltage with the passing of time, caused by hydrogen can be reduced.

Particularly, in nitride semiconductor laser 3 according to this embodiment, aside from electrode component 50, pad components 53 are also not in contact with dielectric layer 60, and thus diffusion of hydrogen from dielectric layer 60 to electrode component 50 can be prevented even when junction-down mounting is adopted as illustrated in FIG. 10. In other words, if pad components 53 and dielectric layer 60 are in contact with each other, there is a risk that, even when electrode component 50 and dielectric layer 60 are not contact with each other, hydrogen contained in dielectric layer 60 may reach electrode component 50 via pad components 53 and first solder layer 103a when nitride semiconductor laser 3 is junction-down mounted. In other words, the hydrogen contained in dielectric layer 60 may reach electrode component 50 via pad components 53 and submount 100, and thus the operating voltage may increase. In response to this, by forming pad components 53 and dielectric layer 60 so as not to be in contact with each other as in nitride semiconductor laser 3 according to this embodiment, the hydrogen contained in dielectric layer 60 can be prevented from reaching electrode component 50 via pad components 53 and submount 100, and thus diffusion of hydrogen from dielectric layer 60 to electrode component 50 can be prevented. Therefore, an increase in the operating voltage caused by hydrogen can be prevented.

Furthermore, in this embodiment, since the pathways of the removing liquid for removing second protection film 92 can be made larger than in Embodiment 2, second protection film 92 can be removed in an even shorter time. Therefore, compared to Embodiment 2, the manufacturing time of nitride semiconductor laser 2 can be reduced. In addition, since the residue of second protection film 92 in spaces 70 can be reliably eliminated, a more reliable nitride semiconductor laser 3 can be realized.

Furthermore, in nitride semiconductor laser 3 according to this embodiment, electrode component 50 includes p-side electrode 51, which is an ohmic electrode, and pad electrode 52 formed on p-side electrode 51 (i.e., the ohmic electrode), and pad components 53 include the same material as the material of pad electrode 52 included in electrode component 50.

According to this configuration, an increase in the operating voltage with energization time can be further reduced. Furthermore, by forming pad components 53 from the same material as pad electrode 52, pad components 53 and pad electrode 52 can be formed easily.

Furthermore, in nitride semiconductor laser 3 according to this embodiment, second nitride semiconductor layer 40 may include p-side contact layer 43 formed as a top layer of ridge portion 40a, and have planar portions 40b disposed lateral to ridge portion 40a, p-side electrode 51 (i.e., the ohmic electrode) is in contact with the upper surface of p-side contact layer 43 which is the upper surface of ridge portion 40a, and pad components 53 are in contact with the upper surfaces of planar portions 40b.

According to this configuration, the drive current of the nitride semiconductor laser flows through p-side electrode 51, which is an ohmic electrode, to ridge portion 40a. In addition, since p-side electrode 51 and ridge portion 40a are in a good state of ohmic contact, current is satisfactorily supplied to ridge portion 40a.

Furthermore, in nitride semiconductor laser 3 according to this embodiment, ridge portion 40a may have a width of at least 10 μm and at most 50 μm.

According to this configuration, a nitride semiconductor laser capable of being operated at a high light output can be realized.

It should be noted that nitride semiconductor laser 3 according to this embodiment can also be manufactured without forming second protection film 92.

Variations, Etc.

Although the nitride semiconductor laser and the nitride semiconductor laser device according to the present disclosure are described above based on the foregoing embodiments, the present disclosure is not limited to the foregoing embodiments.

For example, forms that can be obtained by various modifications to the respective embodiments that may be conceived by those skilled in the art, and forms realized by arbitrarily combining elements and functions in the respective embodiments without departing from the essence of the present disclosure are also included in the present disclosure.

INDUSTRIAL APPLICABILITY

The nitride semiconductor laser and the nitride semiconductor laser device according to the present disclosure can be used as a light source of an image display device, lighting, or industrial equipment, and are particularly useful as a light source of equipment requiring a relatively high light output.

The invention claimed is:
1. A nitride semiconductor laser, comprising:
a first nitride semiconductor layer;
a light-emitting layer on the first nitride semiconductor layer, the light-emitting layer including a nitride semiconductor;
a second nitride semiconductor layer on the light-emitting layer, the second nitride semiconductor layer having a flat portion and a ridge portion extending from the flat portion;
an electrode on the second nitride semiconductor layer, the electrode being wider than the ridge portion; and
a dielectric layer on side surfaces of the ridge portion, the dielectric layer including $SiO_2$, wherein:
the electrode includes an ohmic electrode which is in contact with an upper surface of the ridge portion, and a pad electrode on the ohmic electrode,
the pad electrode is in contact with a top surface of the ohmic electrode and a part of the flat portion,
a space is present between the electrode and the dielectric layer, and
the pad electrode has an opening communicating with the space as seen from above.

2. The nitride semiconductor laser according to claim 1, wherein
the ridge portion has a width of at least 10 μm and at most 50 μm.

3. A nitride semiconductor laser device, comprising:
the nitride semiconductor laser according to claim 1; and
a submount holding the nitride semiconductor laser.

4. The nitride semiconductor laser according to claim 1, wherein:
the second nitride semiconductor layer includes a contact layer as a top layer of the ridge portion, and
the ohmic electrode is in contact with an upper surface of the contact layer which is the upper surface of the ridge portion.

* * * * *